(12) United States Patent
Narayan

(10) Patent No.: US 8,222,740 B2
(45) Date of Patent: Jul. 17, 2012

(54) ZINC OXIDE BASED COMPOSITES AND METHODS FOR THEIR FABRICATION

(76) Inventor: Jagdish Narayan, Raleigh, NC (US)

( * ) Notice: Subject to any disclaimer, the term of this patent is extended or adjusted under 35 U.S.C. 154(b) by 416 days.

(21) Appl. No.: 12/605,013

(22) Filed: Oct. 23, 2009

(65) Prior Publication Data

US 2010/0102450 A1 Apr. 29, 2010

Related U.S. Application Data

(60) Provisional application No. 61/197,535, filed on Oct. 28, 2008.

(51) Int. Cl.
*H01L 23/48* (2006.01)
*H01L 29/40* (2006.01)
*H01L 23/52* (2006.01)

(52) U.S. Cl. ........ 257/760; 257/764; 257/766; 438/609; 438/608

(58) Field of Classification Search .............. 257/43, 257/760, 764, 766; 438/608, 609, 648
See application file for complete search history.

(56) References Cited

U.S. PATENT DOCUMENTS

| | | | |
|---|---|---|---|
| 5,406,123 A | 4/1995 | Narayan | 257/767 |
| 6,423,983 B1 | 7/2002 | Narayan et al. | 257/96 |
| 6,518,077 B2 | 2/2003 | Narayan et al. | 438/22 |
| 7,105,118 B2 | 9/2006 | Narayan et al. | 264/210.6 |
| 7,615,782 B2 * | 11/2009 | Hoshino | 257/59 |
| 2003/0142397 A1 * | 7/2003 | Ando et al. | 359/341.5 |
| 2010/0021626 A1 * | 1/2010 | Hsieh et al. | 427/77 |
| 2010/0072449 A1 * | 3/2010 | Hsieh et al. | 257/4 |
| 2011/0080629 A1 * | 4/2011 | Neuman et al. | 359/265 |

OTHER PUBLICATIONS

Okumu et al., "In situ measurements of thickness changes and mechanical stress upon gasochromic switching of thin $MoO_x$ films", *Journal of Applied Physics*, vol. 95, No. 12, pp. 7632-7636 (Jun. 15, 2004).
Carcia et al., "Synthesis and Properties of Thin Film Polymorphs of Molybdenum Trioxide", *Thin Solid Films*, vol. 155, pp. 53-63 (1987).
Anwar et al., "Optical Properties of Amorphous Thin Films of $MoO_3$ Deposited by Vacuum Evaporation", *Phys. Stat. Sol.*, vol. 109, pp. 469-478 (1988).
Dissanayake et al., "Optical properties of $CrO_2$, $MoO_2$, and $WO_2$ in the range 0.2-6 eV", *Physical Review B.*, vol. 18, No. 12, pp. 6872-6879 (Dec. 15, 1978).
Camacho-Lopez et al., "Structural transformations in $MoO_x$ thin films grown by pulsed laser deposition", *Appl. Phys. A*, vol. 78, pp. 59-65 (2004).

(Continued)

*Primary Examiner* — Sheila V Clark
(74) *Attorney, Agent, or Firm* — The Eclipse Group LLP; David P. Gloekler

(57) ABSTRACT

A transparent, electrically conductive composite includes a layer of molybdenum oxide or nickel oxide deposited on a layer of zinc oxide layer. The molybdenum component exists in a mixed valence state in the molybdenum oxide. The nickel component exists in a mixed valence state in the nickel oxide. The composite may be utilized in various electronic devices, including optoelectronic devices. In particular, the composite may be utilized as a transparent conductive electrode. As compared to conventional transparent conduct oxides such as indium tin oxide, the composite exhibits superior properties, including a higher work function.

20 Claims, 25 Drawing Sheets

OTHER PUBLICATIONS

Julien et al., "Synthesis and characterization of flash-evaporated $MoO_3$ thin films", *Journal of Crystal Growth*, vol. 156, pp. 235-244 (1995).

Khyzhun et al., "XES, XPS and NEXAFS studies of the electronic structure of cubic $MoO_{1.9}$ and $H_{1.63}MoO_3$ thick films", *Journal of Alloys and Compounds*, vol. 366, pp. 54-60 (2004).

Moreira Dos Santos et al., Epitaxial growth and properties of metastable $BiMnO_3$ thin films, *Applied Physics Letters*, vol. 84, No. 1, pp. 91-93 (Jan. 5, 2004).

Woodward, "Octahedral Tilting in Perovskites. I. Geometrical Considerations", *Acta Cryst.*, vol. B53, pp. 32-43 (1997).

Abbattista et al., "Numerous Polymorphic Phases $BaBi_3O_{5.5}$ Related to the Perovskite", *Journal of Solid State Chemistry*, vol. 104, pp. 338-344 (1993).

Svensson et al., "A Molybdenum Oxide with a $WO_3$-Type Structure Obtained by Oxidation of (Orthorhombic) $Mo_4O_{11}$", *Reactivity of Solids*, vol. 3, pp. 33-43 (1987).

Stachiotti et al., "First-principles investigation of $ReO_3$ and related oxides", *Physical Review B*, vol. 55, No. 12, pp. 7508-7514 (Mar. 15, 1997).

Corá et al., "An ab initio Hartree-Fock study of $\alpha$-$MoO_3$", *J. Mater. Chem.*, vol. 7, No. 6, pp. 959-967 (1997).

Corá et al., "Transition Metal Oxide Chemistry: Electronic Structure Study of $WO_3$, $ReO_3$, and $NaWO_3$", *J. Phys. Chem. B*, vol. 101, pp. 3945-3952 (1997).

Spevack et al., "Thermal Reduction of $MoO_3$", *J. Phys. Chem.*, vol. 96, pp. 9029-9035 (1992).

Jiang et al., "Aluminum-doped zinc oxide films as transparent conductive electrode for organic light-emitting devices", *Applied Physics Letters*, vol. 83, No. 9, pp. 1875-1877 (Sep. 1, 2003).

Nasuno et al., "Effect of perforated transparent electrodes on light transmittance and light scattering in substrates used for microcrystalline silicon thin-film solar cells", *Applied Physics Letters*, vol. 88, pp. 071909-1 to 071909-3, (Feb. 14, 2006).

Sang et al., "Performance improvement of CIGS-based modules by depositing high-quality Ga-doped ZnO windows with magnetron sputtering", *Solar Energy Materials & Solar Cells*, vol. 67, pp. 237-245 (2001).

Kim et al., "Transparent conducting aluminum-doped zinc oxide thin films for organic light-emitting devices", *Applied Physics Letters*, vol. 76, No. 3, pp. 259-261 (Jan. 17, 2000).

Bhosle et al., "Metallic conductivity and metal-semiconductor transition in Ga-doped ZnO", *Applied Physics Letters*, vol. 88, pp. 032106-1 to 032106-3 (Jan. 18, 2006).

Bhosle et al., "Electrical properties of transparent and conducting Ga doped ZnO", *Journal of Applied Physics*, vol. 100, pp. 033713-1 to 033713-6 (Aug. 8, 2006).

Bhosle et al., "Gallium-doped zinc oxide films as transparent electrodes for organic solar cell applications", *Journal of Applied Physics*, vol. 102, pp. 023501-1 to 023501-5 (Jul. 16, 2007).

Irwin et al., "p-Type semiconducting nickel oxide as an efficiency-enhancing anode interfacial layer in polymer bulk-heterojunction solar cells", *PNAS*, vol. 105, No. 8, pp. 2783-2787 (Feb. 26, 2008).

Wu et al., "Surface modification of indium tin oxide by plasma treatment: An effective method to improve the efficiency, brightness, and reliability of organic light emitting devices", *Applied Physics Letters*, vol. 70, No. 11, pp. 1348-1350 (Mar. 17, 1997).

Hung et al., "Anode modification in organic light-emitting diodes by low-frequency plasma polymerization of $CHF_3$", *Applied Physics Letters*, vol. 78, No. 5, p. 673-675 (Jan. 29, 2001).

Kolawa et al., "Microstructure of Reactively Sputtered Oxide Diffusion Barriers", *Journal of Electronic Materials*, vol. 17, No. 5, pp. 425-432, (1988).

Bhosle et al., "Epitaxial growth and properties of $MoO_x(2<x<2.75)$ films", *Journal of Applied Physics*, vol. 97, pp. 083539-1 to 083539-6 (2005).

Narayan et al., "Domain epitaxy: A unified paradigm for thin film growth", *Journal of Applied Physics*, vol. 93, No. 1, pp. 278-285 (Jan. 1, 2003).

Schlaf et al., "HOMO/LUMO Alignment at PTCDA/ZnPc and PTCDA/C1InPc Heterointerfaces Determined by Combined UPS and XPS Measurements", *J. Phys. Chem. B*, vol. 103, p. 2984-2992 (Mar. 26, 1999).

Elias Burstein, "Anomalous Optical Absorption Limit in InSb", *Phys. Rev.*, 93, pp. 632-633 (1954).

T.S. Moss, "The Interpretation of the Properties of Indium Antimonide", *Proc. Phys. Soc. London*, Sect. B, 67, pp. 775-782 (1954).

Fang et al., "Magnetron sputtered AZO thin films on commercial ITO glass for application of a very low resistance transparent electrode", *Journal of Physics D: Applied Physics*, vol. 35, pp. 3096-3100 (Nov. 18, 2002).

Armstrong et al., "Interface modification of ITO thin films: organic photovoltaic cells", *Thin Solid Films*, vol. 445, pp. 342-352 (2003).

Peumans et al., "Small molecular weight organic thin-film photodetectors and solar cells", *Journal of Applied Physics*, vol. 93, No. 7, pp. 3693-3723 (Apr. 1, 2003).

C.W. Tang, "Two-layer organic photovoltaic cell", *Applied Physics Letters*, vol. 48, No. 2, pp. 183-185 (Jan. 1986).

Xue et al., "4.2% efficient organic photovoltaic cells with low series resistances", *Applied Physics Letters*, vol. 84, No. 16, pp. 3013-3015 (Apr. 19, 2004).

Tadatsugu Minami, "Transparent conducting oxide semiconductors for transparent electrodes", *Semiconductor Science and Technology*, vol. 20, pp. S35-S44 (Mar. 15, 2005).

Bozano et al., "Organic Materials and Thin-Film Structures for Cross-Point Memory Cells Based on Trapping in Metallic Nanoparticles", *Advanced Functional Materials*, vol. 15, pp. 1933-1939 (Nov. 7, 2005).

Vaufrey et al., "ITO-on-top organic light-emitting devices: a correlated study of opto-electronic and structural characteristics", *Semicoductor Science and Technology*, vol. 18, pp. 253-260 (2003).

Baldo et al., "Organic Vapor Phase Disposition", *Advanced Materials*, vol. 10, No. 18, pp. 1505-1514 (1998).

Yang et al., "Morphology control and material mixing by high temperature organic vapor-phase deposition and its application to thin-film solar cells", *Journal of Applied Physics*, vol. 98, pp. 014906-1 to 014906-10 (2005).

Bhosle et al., "Microstructure and electrical property correlations in Ga:ZnO transparent conducting thin films", *Journal of Applied Physics*, vol. 100, pp. 093519-1 to 093519-7 (Nov. 10, 2006).

Zhang et al., "Scattering mechanisms of charge carriers in transparent conducting oxide films", *Applied Physics A*, vol. 62, pp. 487-492 (1996).

Tsurumi et al., "Electric Properties of Zinc Oxide Epitaxial Films Grown by Ion-Beam Sputtering with Oxygen-Radical Irradiation", *Japanese Journal of Applied Physics*, vol. 38, pp. 3682-3688 (1999).

Hamberg et al., "Evaporated Sn-doped $In_2O_3$ films: Basic optical properties and applications to energy-efficient windows", *Journal of Applied Physics*, vol. 60, No. 11, pp. R-123 to R159 (Dec. 1, 1986).

Peumans et al., "Very-high-efficiency double-heterostructure copper phthalocyanine/$C_{60}$ photovoltaic cells", *Applied Physics Letters*, vol. 79, No. 1, pp. 126-128 (Jul. 2, 2001).

Tang et al., "Effects of aquaregia treatment of indium-tin-oxide substances on the behavior of double layered organic light-emitting diodes", *Applied Physics Letters*, vol. 70, No. 20, pp. 2741-2743 (May 19, 1997).

So et al., "Surface preparation and characterization of indium tin oxide substrates for organic electroluminescent devices", *Applied Physics A: Materials Science & Processing*, vol. A68, pp. 447-450 (1999).

Bernéde et al., "Improvement of organic solar cell performances using a zinc oxide anode coated by an ultrathin metallic layer", *Applied Physics Letters*, vol. 92, pp. 083304-1 to 083304-3 (2008).

Dutta et al., "$MoO_x$ modified ZnGaO based transparent conducting oxides", *Journal of Applied Physics*, vol. 105, pp. 053704-1 to 053704-8 (Mar. 4, 2009).

Sato et al., "Transparent conducting p-type NiO thin films prepared by magnetron sputtering", *Thin Solid Films*, vol. 236, pp. 27-31 (1993).

Yamamoto et al., "Emission characteristics of a conical field emission gun", J. Vac. Sci. Technol. B, vol. 16, No. 5, pp. 2871-2875 (Sep./Oct. 1998).

Grosvenor et al., "New interpretation of XPS spectra of nickel metal and oxides", *Surface Science*, vol. 600, pp. 1771-1779 (2006).

Miyata et al., "Preparation and electrochromic properties of rf-sputtered molybdenum oxide films", *J. Appl. Phys.*, vol. 58, No. 4, pp. 1651-1655 (Aug. 15, 1985).

Colton et al., "Electrochromism in some thin-film transition-metal oxides characterized by x-ray electron spectroscopy", *J. Appl. Phys.*, vol. 49, No. 1, pp. 409-416 (Jan. 1978).

Mohamed et al., "Correlation between structure, stress and optical properties in direct current sputtered molybdenum oxide films", *Thin Solid Films*, vol. 429, pp. 135-143 (2003).

Zhang et al., "Effect of Support in Ethanol Oxidation on Molybdenum Oxide", *J. Phys. Chem.*, vol. 99, pp. 14468-14476 (1995).

Kolawa et al., "Microstructure of Reactively Sputtered Oxide Diffusion Barriers", Journal of Electronic Materials, vol. 17, No. 5, pp. 425-432 (1988).

Ohtsuka et al., "Characterization of $MoO_{3-x}$ Thin Films", *Jpn. J. Appl. Phys.*, vol. 40, pp. 4680-4683 (2001).

\* cited by examiner (a)

(b)

US 8,222,740 B2

ZINC OXIDE BASED COMPOSITES AND METHODS FOR THEIR FABRICATION

RELATED APPLICATIONS

This application claims the benefit of U.S. Provisional Patent Application Ser. No. 61/197,535, filed Oct. 28, 2009, titled "ZINC OXIDE BASED COMPOSITES FOR USE AS TRANSPARENT CONDUCTIVE ELECTRODES", the content of which is incorporated by reference herein in its entirety.

FEDERALLY SPONSORED SUPPORT

This invention was made with government support under Grant No. ECCS #0653722 by the National Science Foundation. The United States Government may have certain rights in the invention.

TECHNICAL FIELD

The present invention relates generally to transparent conductive oxides, devices employing transparent conductive oxides, and methods for fabricating transparent conductive oxides and related devices. More particularly, the present invention relates to transparent conductive oxides that include a composite of zinc oxide and molybdenum oxide or nickel oxide; or, stated differently, a zinc oxide thin film that is surface-modified with an ultrathin molybdenum oxide or nickel oxide overlayer.

BACKGROUND

Research on transparent conducting oxides (TCOs) that offer suitable alternatives to indium tin oxide (ITO) has attracted considerable attention. This is due to the serious concern relating to the cost of ITO, as well as chemical stability in a reduced ambient. The cost of ITO is attributable to the high cost of indium (In) and its limited availability, which is due in part to the rapid increase in production of flat panel displays utilizing ITO. ITO is utilized in numerous types of optoelectronic devices. In particular, organic photovoltaic (OPV) cells have attracted considerable attention in recent years due to their potential for providing low cost solar energy conversion. Since the first bilayer heterojunction solar cell was demonstrated in 1986, there has been considerable development in the field of OPVs. It has recently been demonstrated that solar cells with 3.6±0.2% efficiency can be fabricated using double heterojunction on (ITO) substrates. However, the use of ITO poses a serious problem for the reasons noted above.

Zinc oxide (ZnO) doped with Group III elements (typically aluminum or gallium) is a promising candidate as a TCO because of its superior stability in a hydrogen environment, benign nature and relatively inexpensive supply. These materials have shown promising results when used as anodes in organic photovoltaic (OPV) cells (e.g., organic solar cells (OSCs)), organic light emitting diodes (OLEDs) and other optoelectronic devices.

Highly conducting and transparent Ga:ZnO can be deposited on single-crystalline sapphire substrates as well as glass substrates using pulsed laser deposition (PLD). See Bhosle et al., *Appl. Phys. Lett.* 88, 32106 (2006); Bhosle et al., *Appl. Phys.* 100, 033713 (2006). The electrical properties of the TCO films are determined by the details of microstructure, stoichiometry and defects, which in turn can be controlled by the processing and substrate parameters. The formation of textured <0001> films on amorphous glass substrates poses a major technical challenge in terms of the ability to control the grain size in the nanometer range, the texture, and the grain boundary characteristics in these films to achieve superior properties and device (e.g., solar cell) performance.

The suitability of these nanocrystalline $ZnGa_{0.05}O$ films deposited on glass as the anode of a double heterojunction OPV cell has been demonstrated with power conversion efficiencies >1%. See Bhosle et al., *J. Appl. Phys.* 102, 023501 (2007). The power conversion efficiencies of the $ZnGa_{0.05}O$ based cell were comparable to an ITO-based OPV cell, even though the $ZnGa_{0.05}O$ based cell showed relatively higher contact resistance. This was attributed to the film surface and interface characteristics of $ZnGa_{0.05}O$ with the organic layer owing to the lower work function of ZnO-based TCOs, which determines the energy level alignment at the $ZnGa_{0.05}O$/organic layer interface.

In the present disclosure, it is proposed that while low resistivity and high % T (transmittance) are prerequisites for superior device performance, another important parameter is the surface work function of the TCO. The lower work function of conventional TCOs makes it difficult to achieve ohmic contacts at the interface, which increases the series resistance and limits the realization of maximum theoretical open-circuit voltage ($V_{oc}$) in OSCs. In the case of OLEDs, the surface work function affects the energy barrier height at the interface of the TCO with the organic semiconductor layer, playing a role in enhancing the hole injection efficiency and reducing the operating voltages of the device. Another important issue is the interface stability between the TCO and the organic layer in the device, which is critical for reliability and long-term performance. Therefore, the diffusion barrier characteristics of the TCO play an important role in this regard.

Accordingly, there is a need for non-ITO based TCOs, and methods for fabricating such TCOs, which exhibit high work function, high optical transparency, low sheet resistance, high conductivity (low resistivity), and excellent interface stability, particularly as compared to ITO-based TCOs. There is also a need to for non-ITO based TCOs that can be made commercially available at lower cost as compared to ITO-based TCOs.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a transparent, electrically conductive composite heterostructure includes a first layer including ZnO and a second layer including $MoO_x$ or $NiO_x$ disposed on the first layer. Typically, the ZnO is doped with Ga and/or Al. The concentration of the Group III dopant in the ZnO layer may range from 0.05 to 5 atomic %.

In some implementations, the $MoO_x$ layer may be doped with an electron donating species having a higher valence state than $Mo^+$ such as, for example, $Mn^{7+}$ or $Re^{7+}$ to enhance its conductivity, while attaining a high work function of, for example, 5.2 eV.

In some implementations, the $NiO_x$ layer may be doped with lithium (Li) or sodium (Na) to enhance its conductivity, while attaining a high work function of, for example, 5.3 eV.

In some implementations: The ZnO layer may have a thickness ranging from 5 to 1000 nm. The $MoO_x$ layer may have a thickness ranging from 0.5 to 10 nm The $MoO_x$ layer may include a mixture of $Mo^{4+}$, $Mo^{5+}$ and $Mo^{6+}$ oxidation states. The ratio of ($Mo^{4+}$, $Mo^{5+}$) to $Mo^{6+}$ may range from 2:1 to 4:1, and x may range from 2.0 to 2.75. The ZnO layer and the $MoO_x$ layer may be predominantly monocrystalline and have a predominantly (0001) crystallographic orientation.

In other implementations: The ZnO layer may have a thickness ranging from 5 to 1000 nm. The $NiO_x$ layer may have a thickness ranging from 0.4 to 8 nm The $NiO_x$ layer may include a mixture of $Ni^{2+}$ and $Ni^{3+}$ oxidation states. The ratio of $Ni^{3+}$ to $Ni^{2+}$ may range from 2:1 to 4:1, and x may range from 0.8 to 1.2. The ZnO layer and the $NiO_x$ layer may be predominantly monocrystalline. The ZnO layer may have a predominantly (0001) crystallographic orientation, and the $NiO_x$ layer may have a predominantly [111] crystallographic orientation.

In various implementations: The optical transmittance of the composite structure may be 80% or greater, and in some examples 85% or greater. The composite structure may have a sheet resistance ranging from 1 to 10 $\Omega/\square$. The composite structure may have a resistivity ranging from 70 to 150 $\mu\Omega cm^{-1}$ at room temperature. The composite structure may have a work function ranging from 4.4 to 5.3 eV. The composite structure may exhibit n-type conductivity.

In some examples in which the composite includes a $MoO_x$ layer, the composite may have a work function ranging from 4.4 to 5.1 eV. In other examples, the composite may have a work function ranging from 4.4 to 5.2 eV.

In some examples in which the composite includes a $NiO_x$ layer, the composite may have a work function ranging from 5.2 to 5.3 eV. In other examples, the composite may have a work function ranging from 5.1 to 5.3 eV.

In some examples, the $MoO_x$ layer may have a thickness ranging from 0.5 to 10 nm, and the optical transmittance of the composite structure may be 80% or greater.

In some examples, the $MoO_x$ layer may have a thickness ranging from 0.5 to 10 nm, and the composite structure may have a work function ranging from 4.4 to 5.2 eV.

In some implementations, the NiO layer may have a thickness ranging from 0.4 to 8 nm, and the optical transmittance of the composite structure may be 85% or greater.

In some implementations, the NiO layer may have a thickness ranging from 0.4 to 8 nm, and the composite structure may have a work function ranging from 5.1 to 5.3 eV.

According to another implementation, the composite structure further includes a substrate on which the ZnO layer is disposed. The substrate may be a ceramic, metal or metal-inclusive compound or alloy, a polymer, a dielectric or insulating material, or a semiconductor. The substrate may be transparent or opaque. In some examples, the substrate may be sapphire or glass.

According to another implementation, a method is provided for fabricating a transparent, electrically conductive composite structure. A first layer including ZnO is deposited on a substrate. A second layer including $MoO_x$ or $NiO_x$ is deposited on the first layer. The substrate may be retained, or may be removed by any suitable technique.

The ZnO layer and the $MoO_x$ (or $NiO$)$_x$ layer may be deposited by, for example, pulsed laser deposition (PLD), thermal evaporation, electron beam evaporation, chemical vapor deposition (CVD), metalorganic CVD (MOCVD), spin coating (which may be sol gel based), radio-frequency (RF) or magnetron sputtering, molecular beam epitaxy (MBE), ion beam sputtering, or laser MBE.

The work function of the composite structure may be tuned by controlling the thickness of the $MoO_x$ (or $NiO_x$) layer, by controlling the relative concentrations of the $Mo^{4+}$, $Mo^{5+}$ and $Mo^{6+}$ (or $Ni^{2+}$ and $Ni^{3+}$) valence states, by controlling one or more deposition parameters, and/or by annealing the composite structure in an ambient environment such as air at a predetermined temperature and time duration. The optical transmittance of the composite structure may be controlled or adjusted by controlling the respective thicknesses of the ZnO layer and the $MoO_x$ (or $NiO_x$) layer.

In some implementations, the ZnO layer and the $MoO_x$ or $NiO_x$ layer may be deposited by applying a pulsed laser to a ZnO target and to a molybdenum oxide target or nickel oxide target in a PLD chamber. By "molybdenum oxide target" or "nickel oxide target" is meant any suitable target or combination of targets that provide the source material necessary for depositing the $MoO_x$ or $NiO_x$ layer having the compositions disclosed herein. As one example, the molybdenum oxide target may include a molybdenum metal strip mounted on a $MoO_2$ target. As another example, the nickel oxide target may be a solid nickel oxide target. The nickel oxide compound initially provided as the target may be stoichiometric. In implementations in which a dopant is added, such as for example Mn or Re in the case of $MoO_x$ and Li or Na in the case of $NiO_x$, the dopant may be mixed into the target or selectively ablated by covering part of the target with pure dopant.

In various implementations: The partial pressure of $O_2$ in the PLD chamber during growth of the ZnO layer and the $MoO_x$ (or $NiO_x$) layer may range from about $1\times10^{-2}$ to $1\times10^{-4}$ Torr. The substrate (or deposition) temperature during growth of the ZnO layer and the $MoO_x$ (or $NiO_x$) layer may range from about 200 to 600 °C. The laser may be applied at a wavelength of 193 nm, 248 nm, or 308 nm. For the ZnO target, the laser may be applied at a pulse duration ranging from 10 to 40 ns, a laser energy ranging from 2 to 5 $J/cm^2$, and a repetition rate ranging from 1 to 100 Hz. For the molybdenum oxide or nickel oxide target, the laser may be applied at a pulse duration ranging from 10 to 40 ns, a laser energy ranging from 4 to 7 $J/cm^2$, and a repetition rate ranging from 1 to 100 Hz.

In various implementations utilizing PLD or a similar technique: The thickness of the $MoO_x$ or $NiO_x$ layer may be controlled by controlling the repetition rate and the number of pulses, and/or the substrate (or deposition) temperature. The work function of the composite structure may be controlled or adjusted by controlling the thickness of the $MoO_x$ or $NiO_x$ layer, the relative concentrations of the $Mo^{4+}$, $Mo^{5+}$ and $Mo^{6+}$ (or $Ni^{2+}$ and $Ni^{3+}$) valence states, and/or one or more of the following deposition parameters: plasma flume parameters or conditions, substrate (or deposition) temperature, laser energy, and/or $O_2$ partial pressure. The work function of the composite structure may be controlled or adjusted by annealing the composite structure in an ambient environment such as air at a predetermined temperature and time duration.

According to another implementation, a method is provided for increasing the work function of a ZnO film, by depositing a $MoO_x$ or $NiO_x$ film on the ZnO film, wherein the thickness of the as-deposited $MoO_x$ or $NiO_x$ film is sufficient to increase the work function of the resulting composite film relative to the ZnO film without the $MoO_x$ or $NiO_x$ film. The $MoO_x$ or $NiO_x$ film is thin relative to the ZnO film. Alternatively or additionally, the work function is increased by controlling the relative concentrations of the $Mo^{4+}$, $Mo^{5+}$ and $Mo^{6+}$ (or $Ni^{2+}$ and $Ni^{3+}$) valence states, by controlling certain deposition parameters, and/or by annealing the composite structure.

According to another implementation, an electronic device includes a semiconductor-based structure, and a transparent, electrically conductive composite structure disposed on the semiconductor-based structure. The composite structure includes a ZnO layer and a $MoO_x$ or $NiO_x$ layer disposed on the ZnO layer. The semiconductor-based structure may include an organic layer and/or an inorganic layer, and may include one or more electronic junctions.

Examples of electronic devices include, but are not limited to, various types of optoelectronic devices such as photovoltaic cells, optical sensors, chromogenic (photochromic, electrochromic or gasochromic) devices, display devices (including flat panel displays), and electroluminescent devices, as well as non-optical electronic devices.

In one implementation, the electronic device is an organic solar cell. The organic solar cell may include an organic semiconductor region configured for generating excitons in response to incident light, a TCO anode disposed in electrical contact with the organic semiconductor region, and a cathode disposed in electrical contact with the organic semiconductor region. The TCO includes a ZnO layer and a $MoO_x$ or $NiO_x$ layer disposed on the ZnO layer. The organic semiconductor region may include an electron donor layer and an electron acceptor layer. In some implementations, the organic semiconductor region may further include an exciton blocking layer between the TCO anode and the electron donor layer, and/or between the cathode and the electron acceptor layer. The power conversion efficiency of the organic solar cell may range from 1 to 10%.

In another implementation, the electronic device is an inorganic solar cell in which the semiconductor region includes one or more inorganic semiconductor layers.

In other implementations, the electronic device is an organic or inorganic light-emitting device.

According to another implementation, a method is provided for fabricating an electronic device. A $MoO_x$ or $NiO_x$ layer is deposited on a ZnO layer to a form transparent, electrically conductive composite structure. A semiconductor-based structure is placed in electrical contact with the composite structure.

In one implementation, one or more layers of the semiconductor-based structure may be deposited on a substrate. In another implementation, the semiconductor-based structure may be placed in electrical contact with the composite structure by depositing one or more layers of the semiconductor-based structure on the composite structure. Moreover, the ZnO layer and the $MoO_x$ or $NiO_x$ layer may be deposited in a deposition chamber, and at least one of the layers of the semiconductor-based structure may be deposited in the same deposition chamber Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 22 is a set of UV-Vis transmission spectra of the NiO$_x$ (4 nm)/Zn$_{0.95}$Ga$_{0.05}$O films at different substrate temperatures (TO.

DETAILED DESCRIPTION

Figure 1:
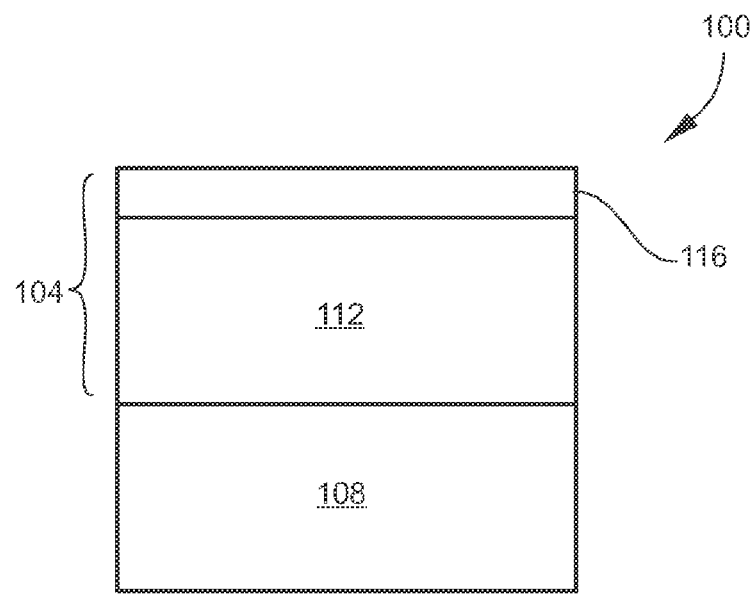
FIG. 1 is a schematic cross-sectional view of an example of a composite TCO disposed on a substrate according to certain implementations of the present disclosure.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

As used herein, the term "ZnO" generically refers to a doped or undoped zinc oxide compound or an alloy thereof. ZnO may be doped with Group III atoms such as gallium (Ga) (which may be referred to as GZO), aluminum (Al) (which may be referred to as AZO), or both Ga and Al (which may be referred to as GAZO). ZnO may thus alternatively be designated (Al,Ga):ZnO, Al:ZnO, Ga:ZnO, ZnO:(Al,Ga), ZnO:Al, or ZnO:Ga. The compositional stoichiometry of GZO or AZO is designated as Zn$_x$Ga$_y$O or Zn$_x$Al$_y$O, where x+y=1, and where for Ga y ranges from 0.005 to 0.05, and for Al y ranges from 0.005 to 0.08. For GAZO or Zn$_x$ Al$_y$ Ga$_z$O, x+y+z=1, $0 \leq x \leq 1$, $0 \leq y \leq 1$, and $0 \leq z \leq 1$.

As used herein, the term "MoO$_x$" refers to a molybdenum oxide compound. MoO$_x$ may be non-stoichiometric or sub-stoichiometric, with a mixed Mo valence state in the MoO$_x$ structure. The subscript x indicates that the molybdenum component may exist simultaneously in the oxide in each of the three oxidization states Mo$^{4+}$, Mo$^{5+}$ and Mo$^{6+}$. An as-deposited MoO$_x$ film may be characterized by its ratio of (Mo$^{4+}$, Mo$^{5+}$) to Mo$^{6+}$, which ranges from 2:1 to 4:1, with x ranging from 2 to 2.75. The MoO$_x$ layer may be doped with an electron donating species having a higher valence state than Mo$^+$ such as, for example, Mn$^{7+}$ or Re$^{7+}$ to enhance its conductivity.

As used herein, the term "NiO$_x$" refers to a nickel oxide compound. NiO$_x$ may be non-stoichiometric, wherein the Ni:O ratio deviates from 1:1. The subscript x indicates that the nickel component may exist simultaneously in the oxide in each of two oxidization states Ni$^{2+}$ and Ni$^{3+}$. An as-deposited NiO$_x$ film may be characterized by its ratio of Ni$^{3+}$ to Ni$^{2+}$, which ranges from 2:1 to 4:1, with x ranging from 0.8 to 1.2. The NiO$_x$ layer may be doped with Li or Na to enhance its conductivity.

For purposes of the present disclosure, the terms "valence state" and "oxidation state" are used interchangeably.

The present disclosure describes the fabrication and structure of a novel composite that includes a thin buffer layer of MoO$_x$ or NiO$_x$ on ZnO, by using pulsed laser deposition (PLD) or other suitable deposition technique. This ZnO-based composite may be utilized in a wide variety of devices. In one particular example, the ZnO-based composite may be utilized as a transparent conductive electrode (TCE, or "transparent conductive oxide" or "TCO") in the place of conventional TCOs such as ITO. As demonstrated herein, the ZnO-based composite solves both the issues of surface characteristics and interface stability. MoO$_x$ and NiO$_x$ have electronic structures that indicate they are highly suitable for use as TCOs. In comparison to known TCOs, MoO$_x$ and NiO$_x$ have superior diffusion barrier properties, provide a higher work function, and improve the transport of the carriers across the heterojunction in a device, thus resulting in increased device efficiency. Therefore, TCOs provided in accordance with the present teachings are well-suited for microelectronics applications and particularly optoelectronics applications and display devices.

MoO$_x$ is an interesting material as it can exist as a combination of different phases or as a single phase with different oxidation states, leading to superior electronic and optical properties. See Bhosle et al., *J. Appl. Phys.* 97, 083539 (2005). MoO$_x$ may have a cubic perovskite structure with a lattice constant of 0.68 nm The band gap of MoO$_x$ varies between 0.7 and 3.1 eV, depending on the fraction of different oxidation states. It has been shown that epitaxial MoO$_x$ films can be successfully grown on sapphire (0001) substrates using PLD. See Bhosle, *J. Appl. Phys.* 97, 083539 (2005). The $MoO_x$ films grew epitaxially on sapphire single crystalline substrates via domain matching epitaxy where integral multiples of lattice planes match across the film-substrate interface. See Narayan and B. C. Larson, *J. Appl. Phys.* 93, 278 (2003). From the (electron and X-ray) diffraction patterns, an $MoO_2$ phase of the film with a monoclinic structure was identified and the lattice parameters were determined as, $a=5.61\pm0.01$ Å, $b=4.856\pm0.01$ Å, $c=5.628\pm0.01$ Å and $\beta=120.6°\pm0.1°$. It was found that the variation of electrical and optical properties was governed by the fraction of different oxidation states of molybdenum, namely ($Mo^{4+}$, $Mo^{5+}$ and $Mo^{6+}$) in the monoclinic phase. The non-stoichiometry of $MoO_x$ could be tuned by optimal target configuration and deposition parameters (e.g., partial pressure of $O_2$, annealing conditions, etc.). Bhosle et al., *J. Appl. Phys.* 97, 083539 (2005).

In specific examples disclosed herein, a ZnO layer (with a composition stoichiometry of $Zn_{0.95}Ga_{0.05}O$) and a $MoO_x$ layer are deposited by PLD on c-plane sapphire substrates and glass substrates. It was found that the films were highly oriented along (0001) direction. The high crystalline quality of the films deposited at different substrate temperatures, $T_s$, was confirmed by X-ray diffraction and selected area diffraction pattern (SAED). In the $MoO_x$ layer, molybdenum was found to exist in $Mo^{4+}$, $Mo^{5+}$ and $Mo^{6+}$ oxidation states and the ratio of ($Mo^{4+}$, $Mo^{5+}$) to $Mo^{6+}$ was determined to be ~2:1 in these examples. The bilayer films showed good optical transparency ($\geqq 80\%$) and a low sheet resistance of 2.5-4 $\Omega/\square$. Different transport behaviors of the $MoO_x/ZnGa_{0.05}O$ films grown at different $T_s$ (substrate temperatures) were observed in temperature-dependent resistivity measurements. The bilayer film at higher $T_s$ showed metallic conductivity behavior down to 113K. Moreover, a blue shift of the absorption edge in the transmission spectra was observed with the increase in $T_s$, indicating an increase in the carrier concentration. It was observed that the $ZnGa_{0.05}O$ films with the ultra thin $MoO_x$ (~1-2 nanometers) overlayer showed a higher work function (varying from 4.7 eV to 5.1 eV) as compared to a single-layer $ZnGa_{0.05}O$ film (~4.4 eV). A correlation between the surface work function and $MoO_x$ layer thickness was observed. The higher work function of the $MoO_x$ overlayer is envisaged to improve the transport of the carriers across the heterojunction in a device, thus resulting in an increase in device efficiency. The $MoO_x$ layer may be doped with an electron donating species having a higher valence state than $Mo^+$ such as, for example, $Mn^+$ or $Re^+$ to enhance its conductivity.

In other implementations, $NiO_x$ may be employed to obtain many or all of the same advantages as regards the $MoO_x$ described above. For instance, a $NiO_x/ZnO$ composite may be useful as a p-type contact (or "p-contact"). Accordingly, the present description when referring to $MoO_x$ also applies to $NiO_x$ unless specified otherwise. Nickel oxide is a p-type semiconductor with a band gap energy ranging from 3.6 to 4.0 eV. In some examples described below, a heterostructure film is grown that includes a thin overlayer of p-type $NiO_x$ on Ga-doped ZnO (GZO) film by PLD. As in the case of $MoO_x$, the p-type $NiO_x$ overlayer also exhibits higher work function and is envisaged to facilitate hole conduction across the heterojunction in the solid state device, thus resulting in increased device efficiency. The crystalline quality of the $NiO_x/ZnO$ bilayer films was investigated by X-ray diffraction. In certain examples described below, the NiO layer shows a preferred orientation along the [111] direction on $ZnGa_{0.05}O$ (0001). In some implementations, the $NiO_x$ is doped with a dopant that increases its conductivity, such as lithium (Li) or sodium (Na). The thickness variation of $NiO_x$ overlayer and Li (5 at %) doping effect on the electrical and optical properties of ($NiO_x/ZnGa_{0.05}O$) bilayer films was also demonstrated. The bilayer films with optimized overlayer thickness showed good optical transparency ($\geqq 85\%$) and a low resistivity of ~$10^{-4}$ $\Omega$-cm. The bilayer film showed metallic conductivity behavior down to 100K. In the $NiO_x$ layer, nickel exists in multiple oxidation states of $Ni^{2+}$ and $Ni^{3+}$. The presence of $Ni^{3+}$ gives rise to p-type conductivity in non-stoichiometric $NiO_x$. The work function of the bilayer films showed higher values in the narrow range from 5.2 to 5.3 eV. As described below, a correlation between the surface work function and $Ni^{3+}/Ni^{2+}$ ratio in the $NiO_x$ layer was also observed. Although stoichiometric NiO is an insulator with a resistivity of $10^{13}$ $\Omega$-cm at room temperature, its resistivity can be decreased by an increase of $Ni^{3+}$ ions, which results from the introduction of nickel vacancies or by doping NiO with monovalent atoms such as Li or Na.

FIG. 1 is a schematic cross-sectional view of an example of a TCO-inclusive article 100 according to certain implementations of the present disclosure. The article 100 includes a composite TCO 104 disposed on a substrate 108. The TCO 104 may have at least a bilayer structure that includes a first layer 112 and a second layer 116. The first layer 112 includes ZnO as described above and the second layer 116 includes $MoO_x$ or $NiO_x$ as described above. For convenience, in the following description the first layer 112 will be referred to as the ZnO layer and the second layer 116 will be referred to as the oxide overlayer unless specifically designated as a $MoO_x$ or a $NiO_x$ layer. The ZnO layer 112 may have a thickness ranging from 6 rim to 10 nm. In another example, the ZnO layer 112 may have a thickness ranging from 5 nm to 1000 Inn. The $MoO_x$ layer 116 may have a thickness ranging from 0.5 inn to 5.0 nm In one specific example, the ZnO layer 112 has a thickness of about 600 nm and the $MoO_x$ layer 116 has a thickness of about 1-2 nm In still other examples, the thicknesses of the ZnO layer 112 and the $MoO_x$ layer 116 may extend higher or lower than the foregoing ranges. In the present context, thickness is defined in the vertical direction from the perspective of FIG. 1, with the understanding that no limitation is placed on the particular orientation of the TCO 104 relative to any particular reference plane.

The substrate 108 may generally have any composition suitable for fabricating the TCO 104 in accordance with the teachings of the present disclosure, and may depend on such factors as the type of deposition technique utilized, whether the substrate 108 needs to be transparent or have any other desired property or quality, whether the substrate 108 needs to be removed from the TCO 104 after fabrication, the end use of the TCO 104 or TCO-inclusive article 100, etc. Thus, the substrate 108 may generally include various ceramics (e.g., sapphire), metals, dielectric materials, electrically conductive or insulating polymers, semiconductors, semi-insulating materials, etc.

The TCO 104 may be fabricated by depositing the ZnO layer 112 and the $MoO_x$ layer 116 on the illustrated substrate 108. In some implementations, a pulsed laser deposition (PLD) technique is utilized to deposit the ZnO layer 112 on the substrate 108 and subsequently deposit the $MoO_x$ layer 116 on the ZnO layer 112. The concept of domain matching epitaxy may be utilized, as disclosed in U.S. Pat. Nos. 5,406,123; 6,423,983; 6,518,077; and 7,105,118. Other vacuum deposition techniques may also be suitable such as, for example, chemical vapor deposition (CVD), metalorganic CVD (MOCVD), thermal evaporation, electron beam evaporation, radio-frequency (RF) or magnetron sputtering, molecular beam epitaxy (MBE), ion beam sputtering, laser MBE, or the like. Still other deposition techniques may also be suitable such as, for example, spin-coating (which may be sol gel based), dip coating, or the like. Dopants such as Mn or Re may be added to the $MoO_x$ by any suitable doping technique.

In other implementations, the second layer 116 may include $NiO_x$ as noted above. Generally, the same fabrication techniques may be utilized as with $MoO_x$. In some examples of utilizing an $NiO_x$ layer 116, the $NiO_x$ layer 116 may have a thickness ranging from 0.4 nm to 8 mm In another example, the $NiO_x$ layer 116 has a thickness of about 4 to 8 nm. In still other examples, the thicknesses of the ZnO layer 112 and the $NiO_x$ layer 116 may extend higher or lower than the foregoing ranges. Dopants such as Li or Na may be added to the $NiO_x$ by any suitable doping technique. The $NiO_x$ based TCO 104 exhibits a work function as high as 5.3 eV, which is even higher than the $MoO_x$ based TCO 104.

Figure 2:
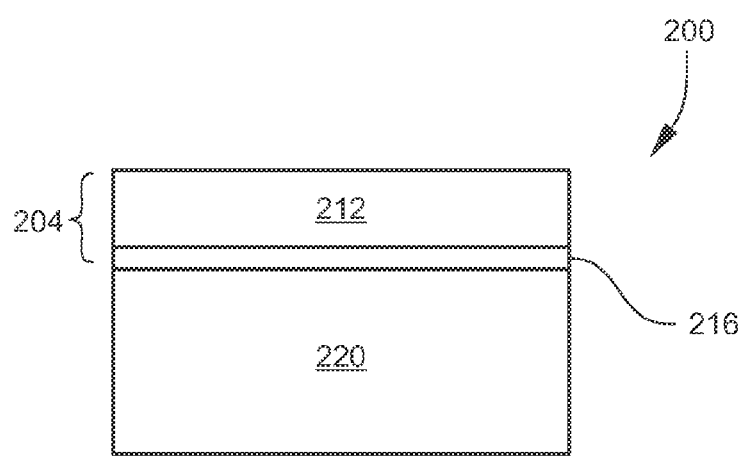
FIG. 2 is a schematic cross-sectional view of an example of a microelectronic device according to various implementations of the present disclosure.

FIG. 2 is a schematic cross-sectional view of an example of an electronic device 200 according to various implementations of the present disclosure. As typical implementations of the electronic device 200 are characterized by micro-scale dimensions and/or features, the electronic device may be referred to as a microelectronic device throughout the present disclosure. The microelectronic device 200 generally includes a composite TCO 204, as disclosed herein, disposed in contact with a semiconductor-based structure 220. The contact made between the TCO 204 and the underlying surface of the semiconductor-based structure 220 is typically an ohmic contact. The substrate on which the TCO 204 was fabricated is not shown. Depending on the type of microelectronic device 200 contemplated, the substrate 208 may be retained or may be removed such as by, for example, dry etching, wet etching, (chemo)mechanical polishing, laser lift-off, or the like. The TCO 204 includes at least a bilayer system of a ZnO layer 212 and an oxide ($MoO_x$ or $NiO_x$) overlayer 216 as described above. In this example, the oxide overlayer 216 is sandwiched between the ZnO layer 212 and the surface of the uppermost layer or region of the semiconductor-based structure 220. The oxide overlayer 216 in this case may serve as a buffer layer or interlayer on which one or more layers of the semiconductor-based structure 220 are deposited. In this case, the semiconductor-based structure 220 may be described as being disposed or formed on the TCO 204. Alternatively, the semiconductor-based structure 220 may be fabricated in a separate process and thereafter coupled to the oxide overlayer 216 by any suitable technique. The TCO 204 may include other types of coatings or layers as needed for the particular type of microelectronic device 200.

The semiconductor-based structure 220 may be any structure that would benefit from the electrically conductive properties and particularly the optically transparent properties of the TCO 204. As non-limiting examples, the semiconductor-based structure 220 may be a photovoltaic device or battery (e.g., solar cell), a light-emitting diode (LED), a laser diode (LD), an optical detector (e.g., photocell), an ultraviolet (UV) detector, a solar-blind detector, a display device (e.g., flat panel display), a chromogenic device, an optical MEMS device, a microfluidic device, a lab-on-a-chip, a surgically implantable device, etc. Examples of devices 200 that may utilize the TCO 204 while not necessarily requiring its optical transparency include various types of non-light-emitting diodes, transistor-based devices such as high electron mobility transistors (HEMTs), field effect transistors (FETs), MEMS devices, microfluidic devices, labs-on-a-chip, and surgically implantable devices, etc.

Figure 3:
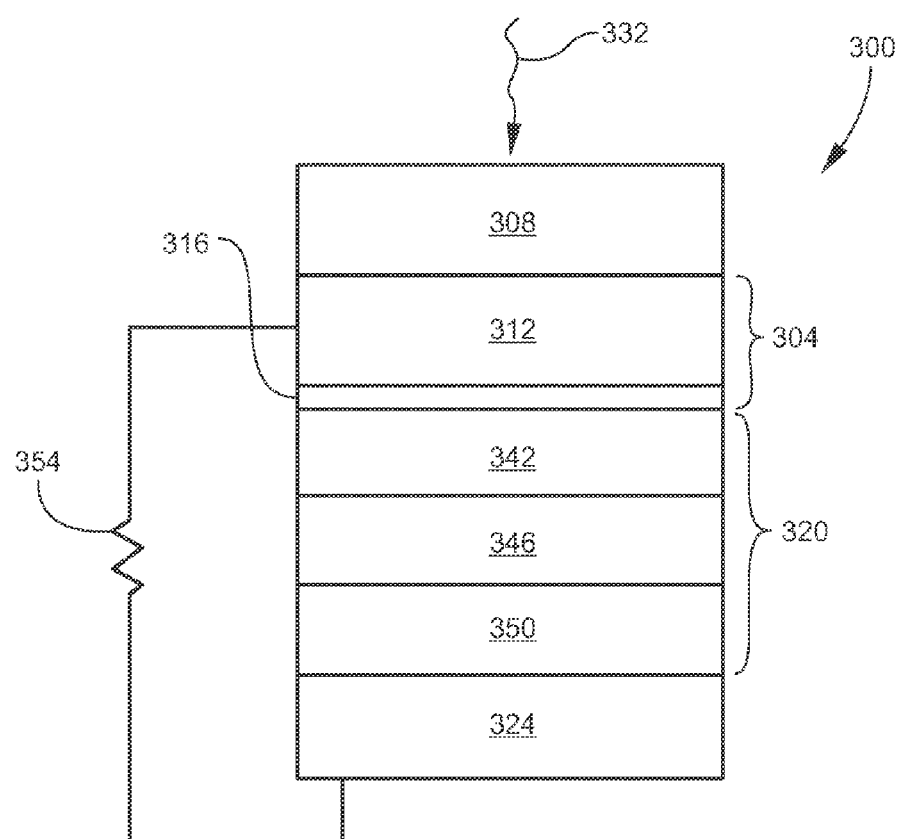
FIG. 3 is a schematic cross-sectional view of an example of an organic photovoltaic (OPV) device according to an implementation of the present disclosure.

FIG. 3 is a schematic cross-sectional view of an example of an organic photovoltaic (OPV) device (e.g., a solar cell) 300 according to an implementation of the present disclosure. The OPV device 300 generally includes a front electrode 304, an organic semiconductor structure (or active region) 320, and a back electrode 324. The front electrode 304 and the back electrode 324 are disposed in contact with opposing surfaces of the organic semiconductor structure 320. The front electrode 304 includes the composite TCO as disclosed herein, and accordingly includes at least the bilayer system of a ZnO layer 312 and an oxide ($MoO_x$ or $NiO_x$) overlayer 316 deposited on a substrate 308, and serves as the anode for the OPV device 300. As illustrated, the substrate 308 on which the TCO was fabricated may be retained to function as a transparent protective layer, in which case an uppermost surface 328 of the substrate 308 receives incident light 332 that is to be converted to electrical energy. Alternatively, the substrate 308 may be removed, in which case an uppermost surface 336 of the TCO may serve as the incident surface. The oxide overlayer 316 may serve as a buffer layer or interlayer on which one or more layers of the organic semiconductor structure 320 are deposited. Alternatively, the organic semiconductor structure 320 may be fabricated in a separate process and thereafter coupled to the oxide overlayer 316 by any other suitable technique. One or more organic layers of the organic semiconductor structure 320 may be deposited in the same deposition chamber utilized for growth of the ZnO layer 312 and the oxide overlayer 316. The layers of the organic semiconductor structure 320 may be deposited by organic vapor-phase deposition (OPVD) or organic molecular beam deposition, or any other suitable deposition technique. Alternatively, one or more layers of the organic semiconductor structure 320 may be deposited by spin-coating, dip coating, evaporation, sublimation, or the like.

The organic semiconductor structure 320 may, for example, include a heterostructure formed by an electron donor (or hole transporting) layer 342 and an electron acceptor (or electron transporting) layer 346. The back electrode 324 (serving as the cathode in the present example) is disposed in ohmic contact with the organic semiconductor structure 320, such as with the electron acceptor layer 346. In some implementations, as in the present example, the organic semiconductor structure 320 further includes an exciton blocking layer 350 disposed on the electron acceptor layer 346 to increase longevity and efficiency, in which case the back electrode 324 is disposed in electrical contact with the exciton blocking layer 350. Alternatively or additionally, another exciton blocking layer (not shown) may be interposed between the electron donor layer 342 and the front electrode 304. To improve efficiency, the organic semiconductor structure 320 may include multiple active photovoltaic junctions or subcells. For instance, the organic semiconductor structure 320 may have a stacked configuration that includes alternating electron donor layers 342 and electron acceptor layers 346. Optionally, conductive layers may be interposed between each heterostructure pair.

The compositions of the electron donor layer 342, the electron acceptor layer 346 and the exciton blocking layer 350 may include any organic molecules or compounds suitable for the respective functions of these layers. Such materials are known to persons skilled in the art. As non-limiting examples, the electron donor layer 342 may include a metal phthalocyanine such as copper phthalocyanine (CuPc). The electron acceptor layer 346 may include the fullerene $C_{60}$, carbon nanotubes, or 3,4,9,10-perylenetetracarboxylic-bis-benzimidazole (PTCBI). The exciton blocking layer 350 may include 2,9-dimethyl-4,7-diphenyl-1,10-phenanthroline (bathocuproine or BCP), bathophenanthroline or (BPhen), 2,9-Bis(naphthalene-2-yl)-4,7-diphenyl-1,10-phenanthroline (NBPhen), or tris-8-hydroxy-quinolinato aluminum (Alq3). Persons skilled in the art will appreciate the applicability of chemical derivatives or relatives of the foregoing examples, as well as similarly behaving alternatives. As also appreciated by persons skilled in the art, the composition of the exciton blocking layer 350 is dictated by whether it is positioned adjacent to the anode 304 or the cathode 324, so that the exciton blocking layer 350 does not impair hole transport or electron transport in the relevant direction. The exciton blocking layer 350 may be a hole blocking layer or an electron blocking layer, as needed. The back electrode 324 may include any suitable metal, such as for example silver (Ag), aluminum (Al), magnesium (Mg), or others, or other electrically conductive material, and may include two or more layers of different metals and/or alloys of different metals. The back electrode 324 may alternatively include a TCO compound or a conductive polymer.

The OPV device 300 may be placed in electrical communication with an electrical power-consuming load 354 (e.g., battery, electrical device, etc.) via electrical leads (e.g., wires, traces, etc.), which may be attached to the front electrode 304 and the back electrode 324 by any suitable means known to persons skilled in the art. The OPV device 300 or an array of many such OPV devices 300 may be packaged as needed by any suitable means known to persons skilled in the art.

As non-limiting examples, the thickness of the ZnO layer 312 in the front electrode 304 may range from 1000 to 8000 Å. The thickness of the oxide overlayer 316 in the front electrode 304 may range from 5 to 100 Å. The thickness of the electron donor layer 342 may range from 100 to 500 Å. The thickness of the electron acceptor layer 346 may range from 100 to 500 Å. The thickness of the exciton blocking layer 350 may range from 100 to 200 Å. The thickness of the back electrode 324 may range from 1000 to 5000 Å.

In one specific yet non-limiting example of the OPV device 300, the substrate 308 is an optical-grade glass. The ZnO layer 312 and the $MoO_x$ (or $NiO_x$) layer 316 are deposited on the substrate 308 via PLD. The doping level of the Ga in the ZnO layer 312 is 5 at. %. The electron donor layer 342 includes copper phthalocyanine (CuPc), and the electron acceptor layer 346 includes the fullerene $C_{60}$. The electron donor layer 342 and the electron acceptor layer 346 are grown on top of the $MoO_x$ layer 316 by organic vapor-phase deposition (OPVD). The exciton blocking layer 350 includes 2,9-dimethyl-4,7-diphenyl-1,10-phenanthroline (BCP), and the back electrode 324 is a single layer of silver (Ag). The BCP and Ag are deposited through a shadow mask with 1 mm diameter openings. In some implementations, all layers of the OPV device 300 are deposited in the same PLD chamber without breaking vacuum, or the Ag may be deposited separately such as by evaporation, sputtering, or the like. The thicknesses of the respective layers in this example are as follows: ZnO (6000 Å)/$MoO_x$ (5 Å)/CuPc (350)/$C_{60}$ (375 Å)/BCP (100 Å)/Ag (1000 Å).

In another implementation, the system of layers illustrated in FIG. 3 may be utilized, or modified and certain layers omitted or added as needed, to produce an organic light-emitting diode (OLED). In most instances, the organic semiconductor structure of the OLED generally includes a junction of a conductive, hole-transporting layer (i.e., a p-type organic semiconductor layer and a light-emissive, electron-transporting layer (i.e., an n-type organic semiconductor layer). To improve efficiency, the organic semiconductor structure may include more than one active photogenic junction. The hole-transporting layer and the light-emissive layer may include any organic molecules or compounds suitable for their respective functions, such as those noted above. An anode is disposed on the hole-transporting layer and a cathode is disposed on the light-emissive layer. The TCO of the present disclosure may be utilized as a transparent anode disposed in contact with the hole-transporting layer (opposite the light-emissive layer). Light generated in the light-emissive layer may thus pass through the hole-transporting layer and the TCO. Additionally or alternatively, the TCO of the present disclosure may be utilized as a transparent cathode disposed in contact with the light-emissive layer to pass light directly from the light-emissive layer. Schematically, the load 354 depicted in FIG. 3 is replaced with a voltage source for OLEDs.

Figure 4:
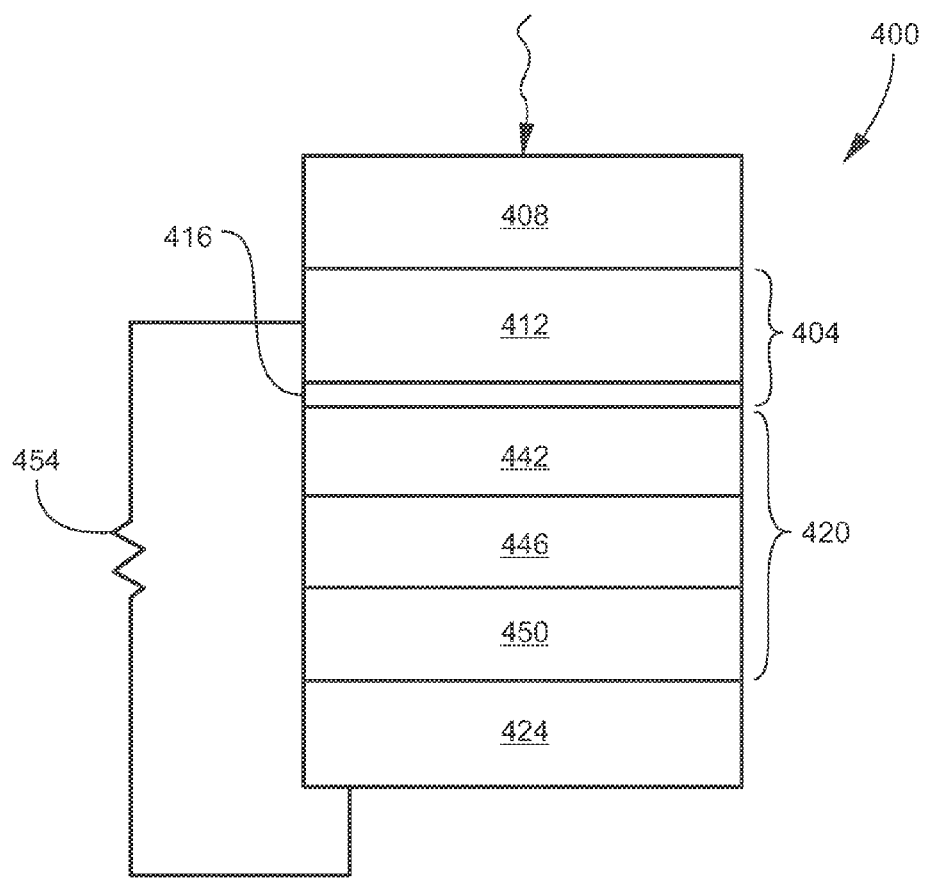
FIG. 4 is a schematic cross-sectional view of an example of an inorganic photovoltaic device according to an implementation of the present disclosure.

FIG. 4 is a schematic cross-sectional view of an example of an inorganic photovoltaic device 400 according to another implementation of the present disclosure. The inorganic photovoltaic device 400 may generally include a front electrode 404, an inorganic semiconductor structure (or active region) 420, and a back electrode 424. The front electrode 404 and the back electrode 424 are disposed in contact with opposing surfaces of the inorganic semiconductor structure 420. The front electrode 404 includes the composite TCO as disclosed herein, and accordingly includes at least the bilayer system of a ZnO layer 412 and a $MoO_{x\,(or\,NiOx)}$ overlayer 416 deposited on a substrate 408. The front electrode 404 serves as the anode for the inorganic photovoltaic device 400. The substrate 408 on which the TCO was fabricated may be retained or removed as previously noted. The $MoO_x$ (or $NiO_x$) overlayer 416 may serve as a buffer layer or interlayer on which one or more layers of the inorganic semiconductor structure 420 are deposited. Alternatively, the inorganic semiconductor structure 420 may be fabricated in a separate process and thereafter coupled to the $MoO_x$ (or $NiO_x$) overlayer 416 by any suitable technique.

The inorganic semiconductor structure 420 generally includes one or more semiconductor layers as needed to create one or more junctions in accordance with inducing the photovoltaic effect, as appreciated by persons skilled in the art. In the present example, the inorganic semiconductor structure 420 includes an intrinsic semiconductor layer 416 sandwiched between an n-type semiconductor layer 450 and a p-type semiconductor layer 442, thereby forming a p-i-n junction, with the p-type semiconductor layer 442 making contact with the $MoO_x$ (or $NiO_x$) overlayer 416 and the n-type semiconductor layer 450 making contact with the back electrode 424. Various alternative inorganic systems suitable for this implementation are appreciated by persons skilled in the art, including for example p-n junctions, Schottky junctions, heterojunctions, multiple junctions, and the like. The layers making up the inorganic semiconductor structure 420 may include, for example, single-crystal, polycrystalline or amorphous silicon (Si); a Si-inclusive compound such as silicon carbide (SiC) or silicon-germanium (SiGe); gallium arsenide (GaAs); cadmium telluride (CdTe); binary, ternary or quaternary Group III-V compounds such as gallium nitride-based compounds, i.e., $Al_xGa_yIn_zN$ (x+y+z=1, $0 \leq x \leq 1$, $0 \leq y \leq 1$, $0 \leq z \leq 1$); and others known to persons skilled in the The various layers of the inorganic semiconductor structure 420 may include dopants as needed for their proper functioning as appreciated by persons skilled in the art. The back electrode 424 may include any suitable metal, and may include two or more layers of different metals and/or alloys of different metals. Depending on the materials selected, the various semiconductor layers and metal contacts may be fabricated by various deposition techniques such as, for example, PLD, CVD, MOCVD, HVPE, sputtering, MBE, ion beam epitaxy, thermal evaporation, electron beam evaporation, sublimation, or the like.

In another implementation, the system of layers illustrated in FIG. 4 may be modified, and other layers omitted or added as needed, to produce an inorganic LED. In most instances, the inorganic semiconductor structure may include a trilayer system similar to that shown in FIG. 4, typically with a photogenically active layer sandwiched between a p-type layer and an n-type layer. The active layer may be an intrinsic layer as described above in conjunction with FIG. 4, or may alternatively be another p-type or n-type layer. The inorganic semiconductor structure may include other types of junctions and more than one junction. The TCO of the present disclosure may be utilized as a transparent anode and/or transparent cathode. In a case where the inorganic semiconductor structure is grown separately from the TCO, it may be desirable to grow the inorganic semiconductor structure on a transparent conductive or semiconductor substrate such as, for example, SiC. Alternatively, the inorganic semiconductor structure may be grown on an insulating substrate such as, for example, sapphire.

EXAMPLE 1

In this Example, experimental results involving optical, structural, chemical and electrical property measurements of $MoO_x/ZnGa_{0.05}O$ bilayers on sapphire and glass substrates are presented. Correlations between the processing parameters, the structure and properties of the bilayer films ($MoO_x/ZnGa_{0.05}O$) for transparent electrode applications were established. It is shown that by growing a thin $MoO_x$ buffer layer on $ZnGa_{0.05}O$, a higher work function can be achieved without affecting the overall transmittance and sheet resistance. It is further shown that the work function of this composite TCO can be tuned by changing the deposition parameters and/or thickness of $MoO_x$ layer.

Ga-doped ZnO (GZO) and $MoO_x$ films were grown on c-plane (0001) sapphire substrates as well as amorphous glass substrates. A pulsed KrF excimer laser of wavelength (248 nm) and pulse duration (25 ns) was used for the deposition. An optimized target for 5 at. % of gallium-doped ZnO was prepared by a conventional solid state reaction technique. A compound target assembly (metal Mo strip mounted on the $MoO_2$ target) was utilized to achieve layer by layer film growth with controlled composition. The chamber was evacuated to a base pressure of $10^{-6}$ Torr prior to growth, and deposition was carried out at oxygen pressure of $\sim 1\text{-}4 \times 10^{-3}$ Torr to control the defects that further influence the electrical and optical properties of the film. A laser energy density of 2-5 J/cm$^2$ with a repetition rate of 10 Hz was used for GZO and 4-7 J/cm$^2$ for $MoO_x$. The deposition was carried out at two different temperatures of 200° C. and 400° C. for the glass and sapphire substrate, respectively. By depositing the GZO layer for 20 minutes, a thickness of ~600±50 nm was obtained. The thickness of the $MoO_x$ layer was carefully controlled by controlling the repetition rate and the number of pulses.

X-ray diffraction (XRD) was utilized to determine the growth orientation and texture of the films A Rigaku Geigerflex diffractometer with Cu $K_\alpha$ radiation ($\lambda$=1.54 Å) and a Ni filter was utilized. The XPS analysis of the films was carried out in a Riber LAS-3000 X-ray photoelectron spectrometer Al $K_\alpha$ X-ray source. The oxidation states of the elements present in the film were analyzed by deconvolution using a Shirley routine and Casa software. The values corresponding to the C 1s peak were used as a reference for the curve fitting analysis. Microstructural and growth characteristics of the as-deposited films were investigated in detail by using a JEOL-2010 field emission transmission electron microscope (TEM), operating at 200 kV with a point-to-point resolution of 0.18 nm. For the TEM observations, cross-section samples were prepared by mechanical polishing, followed by dimpling and Ar-ion milling. The main aim for TEM experiments was to determine the grain size and characteristics of grain boundaries of the GZO layer on glass and to determine the thickness of thin $MoO_x$ layer. Optical transmittance measurements were carried out as a function of wavelength in the range 200-900 nm using a Hitachi U-3010 Spectrophotometer. To understand the affect of microstructure and $MoO_x$ layer on electrical properties of films, electrical resistivity of the films was measured using a four-probe technique in the temperature range of 15-300 K. The contacts on the films were made by using indium dots on the top layer for the electrical measurements. Hall measurements were also performed on these samples using Van der Pauw method. The UPS measurements were conducted with a Kratos Axis Ultra DLD Ultraviolet Photoelectron Spectrometer equipped with a monochromatic He ultraviolet source He I (21.2 eV). A 5 V bias was applied to enhance the extraction of low kinetic energy (KE) electrons and to successfully determine the energy of the low KE edge. The Fermi edge for these samples was determined after sputter cleaning of the surface of the samples with Ar$^+$ ions for 2 minutes in UHV. The samples were mounted with Cu clips grounding the film surface to reduce the possibility of charging effect. All the samples were referenced with a clean gold sample and proper connection of the samples on the same stub ensured that the samples are in electronic equilibrium with the spectrometer.

Figure 5:
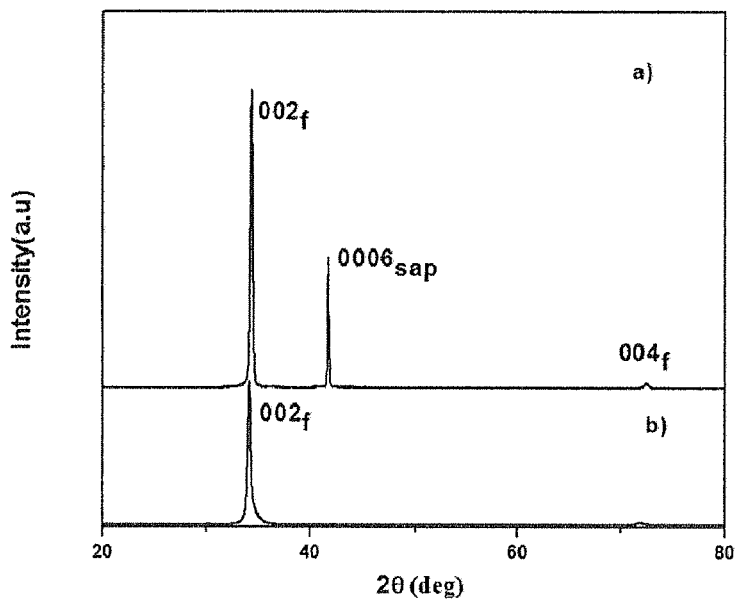
FIG. 5 is an XRD of $MoO_x/Zn_{0.95}Ga_{0.05}O$ films deposited at 200° C. and $1\times10^{-3}$ Torr of oxygen pressure on (a) sapphire and (b) glass.

FIGS. 5(a) and 5(b) show the XRD pattern (θ-2θ scan) of bilayer film ($MoO_x/ZnGa_{0.05}O$) grown at 200° C. and $1 \times 10^{-3}$ Torr of oxygen pressure on c-plane sapphire and amorphous glass substrates, respectively. The FWHM of the (0002) diffraction peak corresponding to $ZnGa_{0.05}O$ obtained from the XRD spectra on sapphire and glass substrates are 0.29° and 0.36°, respectively. The sharp (0006) $ZnGa_{0.05}O$ peak suggests good crystalline growth both on sapphire and amorphous glass substrates at a lower temperature of 200° C. The absence of additional peaks excludes the possibility of any extra phases. However, the $MoO_x$ peak in the film could not be detected in the XRD pattern due to very small thickness. Consequently, the detailed analysis of molybdenum oxide phase was performed by XPS measurements.

Figure 6A:
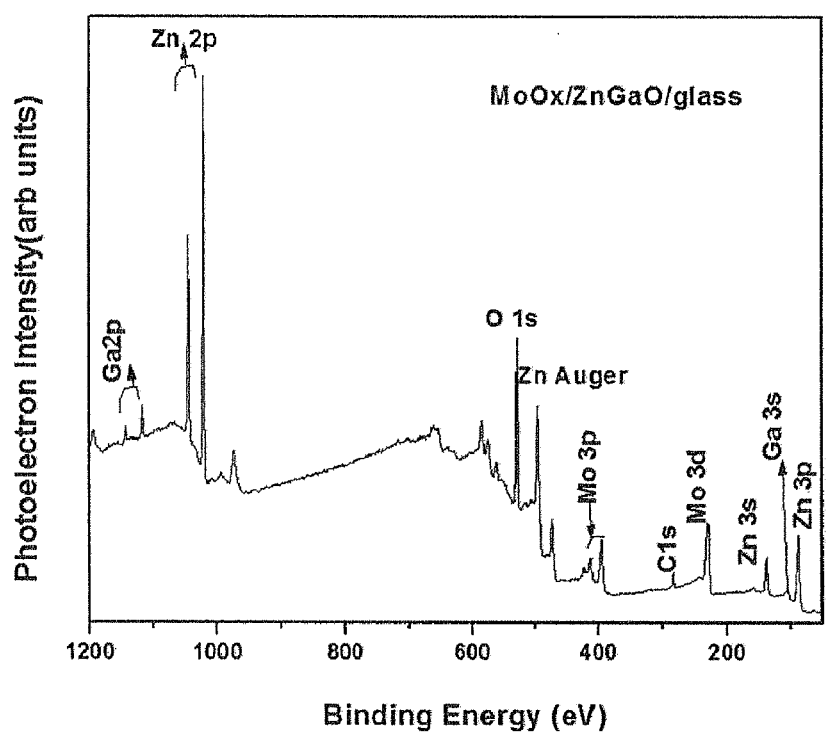
FIG. 6(a) is a survey XPS spectrum from the surface of $MoO_x/Zn_{0.95}Ga_{0.05}O$ film deposited at 200° C. and $1\times10^{-3}$ Torr of oxygen pressure on glass.
Figure 6B:
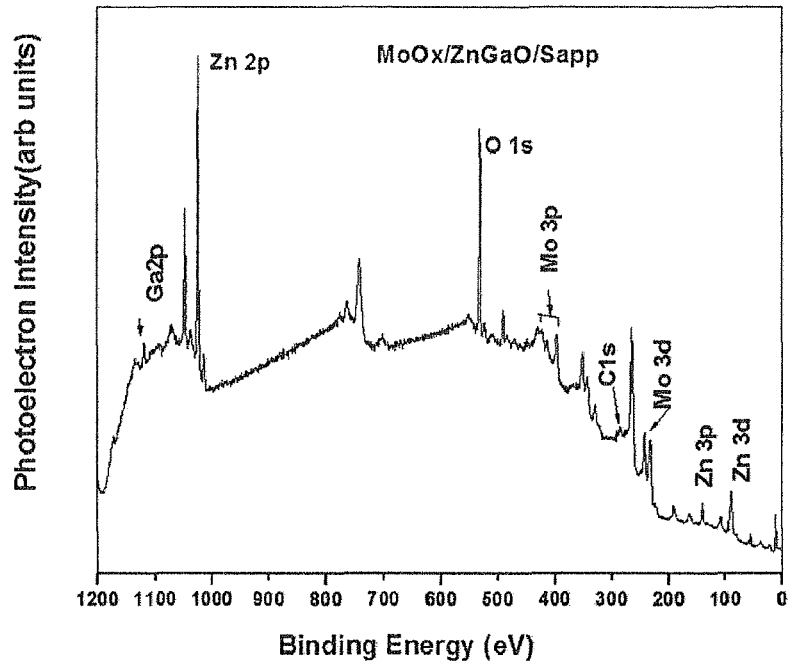
FIG. 6(b) is a survey XPS spectrum of $MoO_x/Zn_{0.95}Ga_{0.05}O$ film deposited at 200° C. and $1\times10^{-3}$ Torr of oxygen pressure on on sapphire.

Referring to FIGS. 6(a)-6(d), the XPS results shown here are from bilayer films ($MoO_x/ZnGa_{0.05}O$) at different growth parameters and substrates, although the deposition time for both the layers was kept constant. The surfaces of the films were cleaned with Ar$^+$ ions for 2 minutes in UHV before the measurement. FIGS. 6(a) and 6(b) show the XPS survey spectrum acquired from the surface of bilayer film ($MoO_x/ZnGa_{0.05}O$) grown at 200° C. on glass and c-plane sapphire, respectively. From FIG. 6(a), the Ga $2p_{3/2}$ and Ga $2p_{1/2}$ peaks are found to be at 1116.7 eV and 1143.6 eV, respectively, which suggests the presence of Ga$^{3+}$. See Bhosle et al., *J. Appl. Phys.* 100, 033713 (2006). Thus, Ga$^{3+}$ can act as a donor and effectively increase the carrier concentration. The peaks corresponding to Mo-3d, Mo-3p and O-1s in FIGS. 6(a) and 6(b) clearly indicate the growth of a molybdenum oxide layer on $ZnGa_{0.05}O$ layer. There is no indication of any extra element present in the film from the XPS data.

Figure 6C:
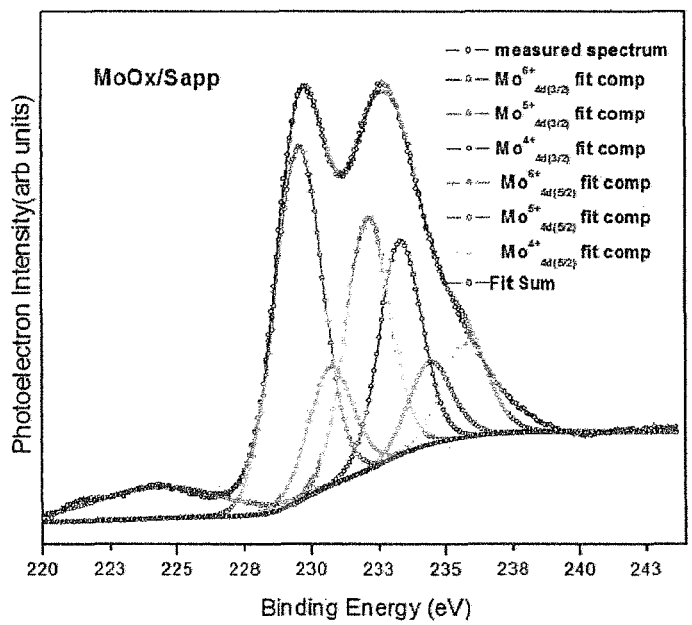
FIG. 6(c) is a high-resolution spectrum of Mo 3d peak from the surface of $MoO_x/Zn_{0.95}Ga_{0.05}O$ on sapphire.

The multiple oxidation states of molybdenum (Mo$^{4+}$, Mo$^{5+}$ and Mo$^{6+}$) in the $MoO_x$ layer have been verified by the high-resolution Mo 3d core level spectrum as shown in FIG. 6(c). The spectrum consists of complex mixture of Mo $3d_{5/2,3/2}$ spin-doublets of molybdenum in its multiple oxidation states of +4, +5 and +6. See Bhosle et al., *J. Appl. Phys.* 97, 083539 (2005). The Mo oxidation states have been resolved by using a non-linear curve fitting technique. The $Mo^{4+}$ ($3d_{5/2}$), $Mo^{5+}$ ($3d_{5/2}$) and $Mo^{6+}$ ($3d_{5/2}$) peak is determined at 229.2 eV, 230.3 eV and 232.1 eV, respectively, and is in accordance with the values reported in earlier work. See Bhosle et al., *J. Appl. Phys.* 97, 083539 (2005). The corresponding fraction of different oxidation states of molybdenum in $MoO_x$ layer was found to be $Mo^{4+}$-58.1%, $Mo^{5+}$-9.3% and $Mo^{6+}$-32.8%. The relative concentration of multiple oxidation states of Mo has been determined by calculating the area under the resolved peaks and the ratio of ($Mo^{4+}$, $Mo^{5+}$) to $Mo^{6+}$ was calculated to be ~2:1.

Figure 6D:
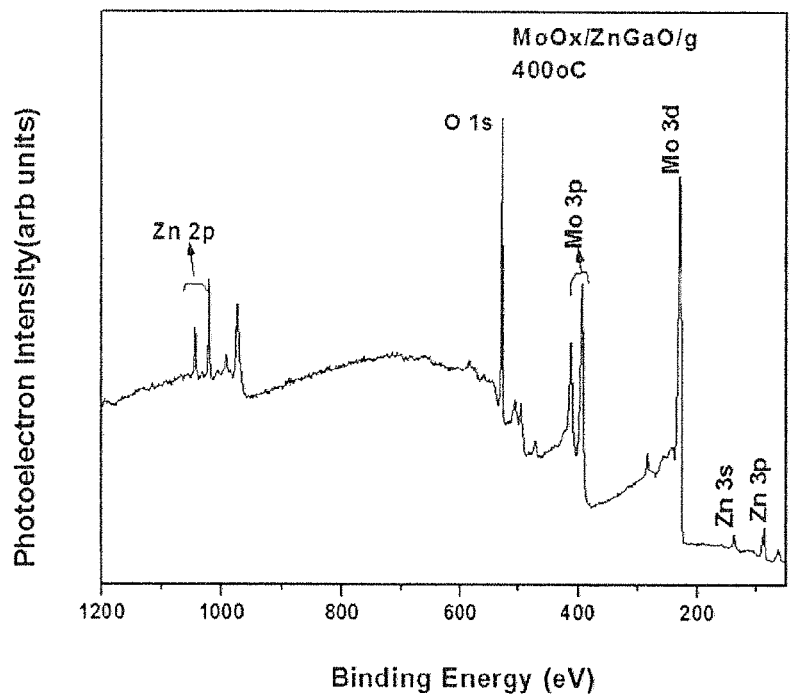
FIG. 6(d) is a survey XPS spectrum of $MoO_x/Zn_{0.95}Ga_{0.05}O$ film deposited at 400° C. and $1\times10^{-3}$ MIT of oxygen pressure on glass.

FIG. 6(d) shows the XPS survey spectrum acquired from the surface of bilayer film ($MoO_x$/$ZnGa_{0.05}O$) grown at 400° C. on glass. It is interesting to note that the relative intensity of Mo 3p, Mo 3d and O 1s peaks to Zn 2p peaks has increased when compared to the XPS survey spectrum at 200° C. $T_s$. In XPS, the X-ray source interacts with the first few monolayers of the film This gives an indication that relatively thicker $MoO_x$ has been grown on $ZnGa_{0.05}O$ at higher substrate temperature as volume interaction with the underlying $ZnGa_{0.05}O$ layer has decreased.

Figure 7A:
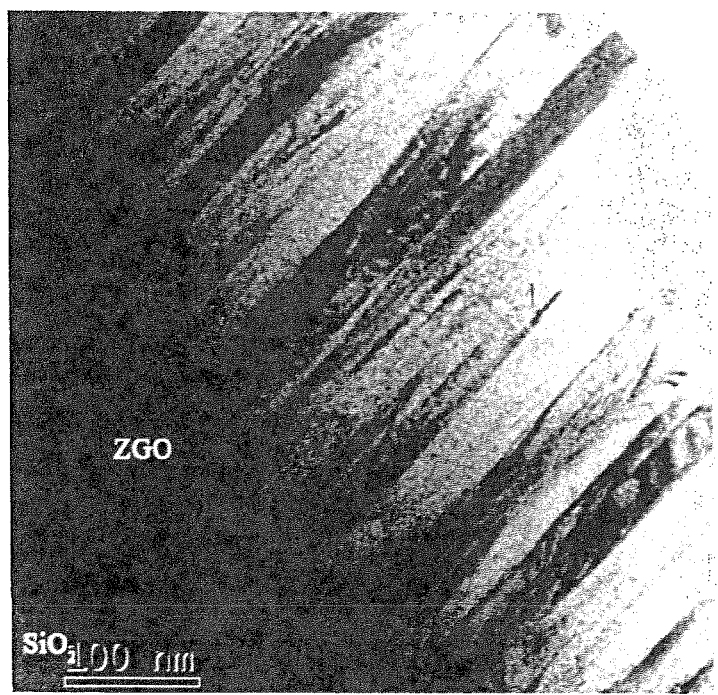
FIG. 7(a) is a bright field image of $MoO_x/Zn_{0.95}Ga_{0.05}O$ film at $T_s=200°$ C. on $Si-SiO_2$ showing the interface of the film and $SiO_2$. The film was capped with alumina ($Al_2O_3$) to protect the $MoO_x$ layer from any damage during TEM sample preparation.
Figure 7B:
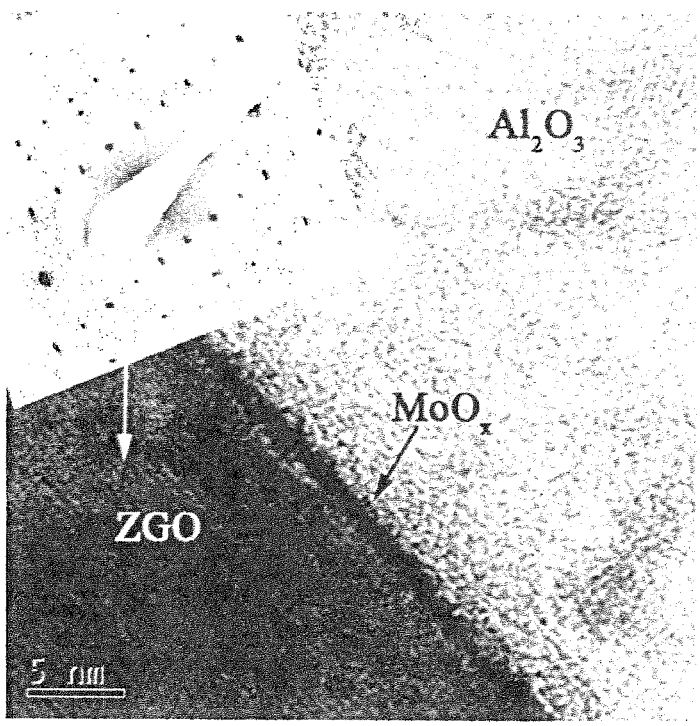
FIG. 7(b) is a low magnification image of $MoO_x/Zn_{0.95}Ga_{0.05}O$ film at $T_s=200°$ C. showing the embedded $MoO_x$ between $Zn_{0.95}Ga_{0.05}O$ and $Al_2O_3$. The inset in FIG. 7(b) shows the SAED of $Zn_{0.95}Ga_{0.05}O$. As $MoO_x$ is very thin, its spots could not be seen in the SAED pattern.

Referring to FIGS. 7(a) and 7(b), detailed TEM analysis was performed on cross-sectioned samples to analyze the film microstructure. The bilayer film was capped with alumina ($Al_2O_3$) post deposition at 100° C. to preserve the thin $MoO_x$ layer from ion milling damage during the TEM sample preparation. A representative bright field TEM micrograph corresponding to a cross-section of the as-grown bilayer film ($MoO_x$/$ZnGa_{0.05}O$) at 200° C. on amorphous Si—$SiO_2$ is presented in FIG. 7(a). This micrograph shows the presence of small angle grain boundaries referred to as sub-grain boundaries. The inset in FIG. 7(b) shows the selected area diffraction pattern (SAED) of ZnGaO layer at 200° C. The spotty patterns indicate a crystalline structure with a small amount of misorientation (depicted by the small arcs). These results suggest that the grain size is greater than 1 μm and the subgrains within one grain are contributing to the SAED pattern. These results along with the X-ray diffraction pattern confirm that the films grown at these temperatures are highly textured along the [0001] orientation. The overall thickness of the film has been estimated to be ~600 nm.

Figure 8A:
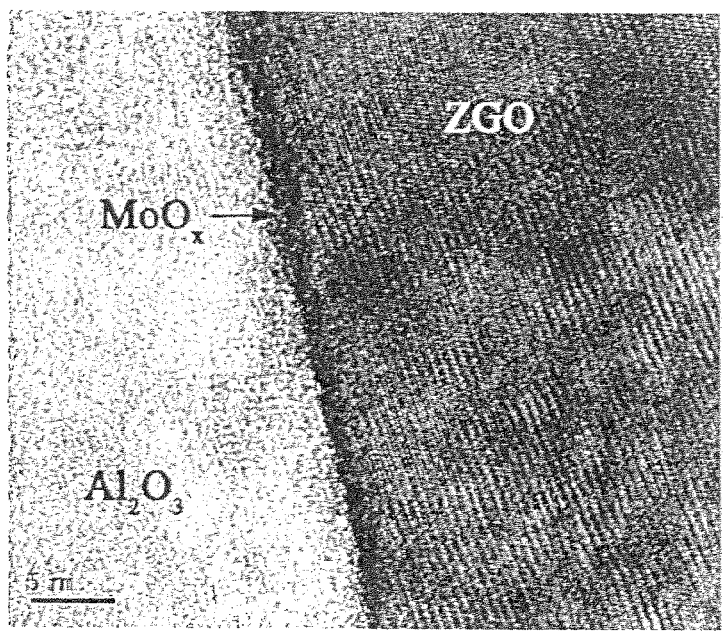
FIG. 8(a) is a low magnification image of $MoO_x/Zn_{0.95}Ga_{0.05}O$ film at $T_s=400°$ C. showing the embedded $MoO_x$ between $Zn_{0.95}Ga_{0.05}O$ and alumina ($Al_2O_3$).

FIGS. 7(b) and 8(a) show the thin $MoO_x$ layer sandwiched between $ZnGa_{0.05}O$ and $Al_2O_3$ at 200° C. and 400° C., respectively. The thickness of $MoO_x$ at a 200° C. substrate temperature is determined to be ~0.9 nm (few monolayers), as shown in FIG. 7(b). However, for the film deposited at a $T_s$ of 400° C., the thickness of $MoO_x$ is determined to be ~1.5 nm (FIG. 8(a)). This data clearly indicates that the thickness of $MoO_x$ layer increases with increasing $T_s$ when grown for the same amount of time. This finding is consistent with the XPS data and may be related to the wettability (sticking coefficient) of $MoO_x$ plasma to the growth surface. It can be further observed from these micrographs that the growth of $MoO_x$ takes place via a 2-D (two-dimensional) growth mode at 200° C. and 400° C. substrate temperatures. The 2-D growth of $MoO_x$ on the $ZnGa_{0.05}O$ template leads to a uniform coverage, which is envisaged to be conducive to improving device performance.

Figure 8B:
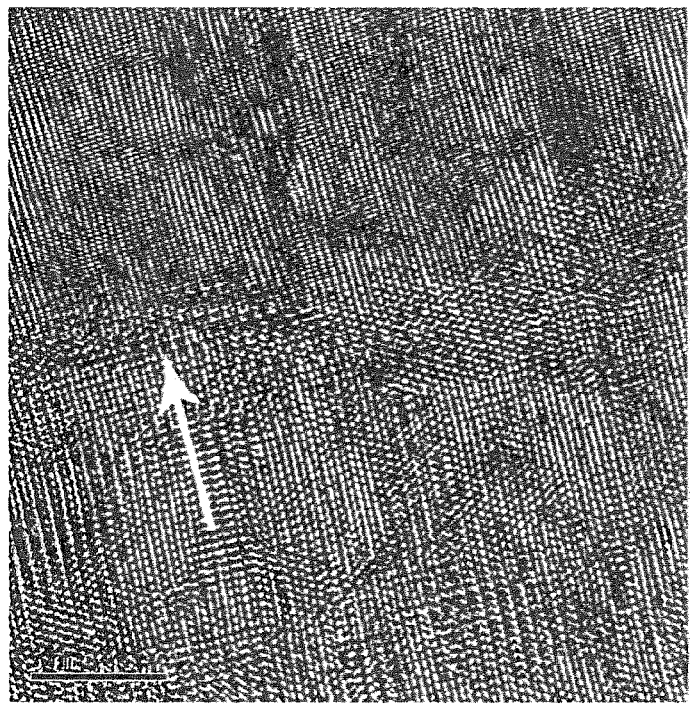
FIG. 8(b) is a HR-TEM of $MoO_x/Zn_{0.95}Ga_{0.05}O$ film at $T_s=400°$ C. showing the $Zn_{0.95}Ga_{0.05}O$ layer. The arrow is indicating the grain boundary.

A typical high resolution TEM (HRTEM) image of ZnGaO layer at 400° C. is presented in FIG. 8(b), which reveals the crystalline nature of the grains. A low angle grain boundary can be observed in the film with the tilt angle of ~1.5°. This is indicative of a good crystalline nature of the growth, which is a critical parameter for superior electrical properties. It should be noted that the growth parameters such as substrate temperature and forward-directedness of the plume are important factors governing the quality and microstructure of the film. It can also be observed that the film is free of any nano-sized clusters or precipitates.

Preliminary optimization of the $MoO_x$ for the top layer was done by varying the film thickness, temperature and in-growth $O_2$ partial pressure in separate $MoO_x$ depositions on sapphire and glass. Series resistance and the optical transmittance, which determine the incident photon absorption, are the dominant factors affecting the device performance. Hence, the films were optimized taking these factors into account on c-plane sapphire and glass substrates. It was found that upon increasing the $MoO_x$ thickness in a range of a few nanometers (~1 to ~3 nm), the transmittance of $MoO_x$/sapphire in the visible region decreased from 80% to 70% at 400° C. deposition temperature and the sheet resistance decreased by one order of magnitude. Moreover, the films at lower temperature showed higher sheet resistance. The same trend was found on glass substrates with higher transmittance and higher sheet resistance value.

Figure 9:
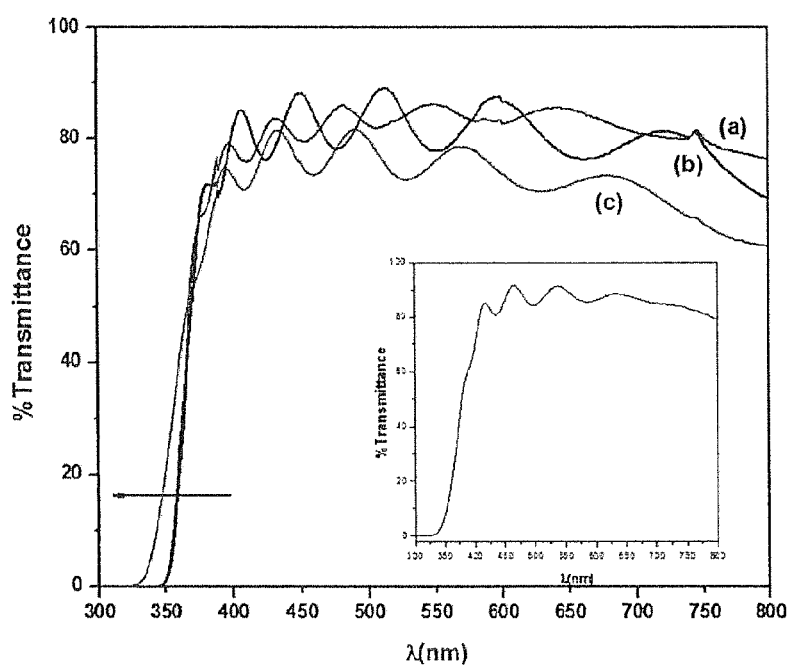
FIG. 9 is a plot of UV-Vis transmission spectra of the $MoO_x/Zn_{0.95}Ga_{0.05}O$ films grown under the following conditions: (a) $T_s$ of 200° C. and $1\times10^{-3}$ Torr of oxygen pressure on sapphire; (b) $T_s$ of 200° C. and $1\times10^{-3}$ Torr of oxygen pressure on glass; and (c) $T_s$ of 400° C. and $1\times10^{-3}$ Torr of oxygen pressure on glass. The inset in FIG. 9 shows the transmission spectra of $Zn_{0.95}Ga_{0.05}O$ film at $T_s$ of 200° C. and $1\times10^{-3}$ Torr of oxygen pressure on glass.

The $MoO_x$/$ZnGa_{0.05}O$ bilayer films were characterized with an optimum range of $MoO_x$ layer thickness. FIGS. 9(a)-9(c) illustrate the transmission spectra of the bilayer film ($MoO_x$/$ZnGa_{0.05}O$) at different temperatures on glass and sapphire substrates, with the inset showing the transmission spectra of the $ZnGa_{0.05}O$/glass at 200° C. Table I below presents the average transmittance values for films at different growth conditions.

TABLE I

Summary of electrical and optical properties for films at different growth conditions.

| | Sheet Resistance Ω/□ | Transmittance (% T) | $E_g$ (eV) | Carrier Concentration ($cm^{-3}$) | Hall mobility μ ($cm^2V^{-1}s^{-1}$) | Room temp resistivity ρ (Ω-cm) | T(K) |
|---|---|---|---|---|---|---|---|
| $Zn_{0.95}Ga_{0.05}O$ ($T_s$-200° C.) | 3 | ~87 | 3.5 | $2.2 \times 10^{21}$ | 13.2 | $2.4 \times 10^{-4}$ | 168 |
| $MoO_x$/$Zn_{0.95}Ga_{0.05}O$ ($T_s$-200° C.) | 4 | ~85 | 3.46 | $2.4 \times 10^{21}$ | 7 | $2.8 \times 10^{-4}$ | — |
| $MoO_x$/$Zn_{0.95}Ga_{0.05}O$ ($T_s$-400° C.) | 2.5 | ~80 | 3.6 | $2.9 \times 10^{21}$ | 8 | $2.2 \times 10^{-4}$ | 113 |

T(K) shows the (metal-to-semiconductor) transition temperature in the resistivity behavior of the samples with temperature.

Figure 10:
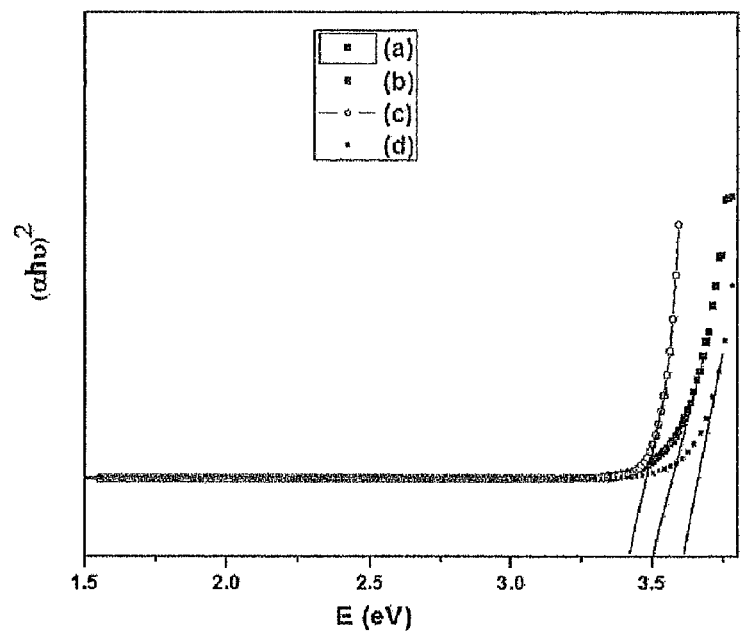
FIG. 10 is a $(\alpha h\nu)^2$ vs $h\nu$ plot for (a) $Zn_{0.95}Ga_{0.05}O$ film at $T_s$ of 200° C.; (b) $MoO_x/Zn_{0.95}Ga_{0.05}O$ films at $T_s$ of 200° C. on glass; (c) $MoO_x/Zn_{0.95}Ga_{0.05}O$ films $T_s$ of 200° C. on sapphire; and (d) $MoO_x/Zn_{0.95}Ga_{0.05}O$ films at $T_s$ of 400° C. on glass.

It can be observed that all of the films show an average transmittance ≧80% in the visible region. There is not much reduction in transmittance of $MoO_x$/$ZnGa_{0.05}O$ with respect to $ZnGa_{0.05}O$/glass. The slightly lower transmittance of $MoO_x$/$ZnGa_{0.05}O$ at 400° C. can be attributed to the increase in carrier concentration. Moreover, the bilayer film deposited at 400° C. shows a blue shift of the absorption edge as compared to the bilayer films deposited at lower substrate temperatures ($T_s$). The optical band gap ($E_g$) can be calculated by assuming a direct transition between valence and conduction bands. The absorption coefficient α obeys the following relationship with $E_g$ near the band gap:

$$(\alpha h\nu)^2 \propto A(h\nu - E_g), \quad (1)$$

where A is a constant, h is Planck's constant, and v is the frequency of the incident photon. The absorption coefficient a was obtained by using the relation:

$$\alpha = -1/d \ln(T), \qquad (2)$$

where T is the transmittance and d is the thickness of the bilayer film The band gap was obtained by extrapolating the linear part of the plot $(\alpha h v)^2$ vs hv to the energy axis as shown in FIG. 10. As $T_s$ is increased from 200° C. to 400° C., $E_g$ increases slightly from 3.46 eV to 3.6 eV. This widening of band-gap is attributed to the Burstein-Moss effect, since the absorption edge of a degenerate semiconductor is shifted to the smaller wavelength with increasing carrier concentration.

The $ZnGa_{0.05}O$/glass film showed a room temperature resistivity of $2.4 \times 10^{-4}$ Ω-cm, Hall mobility of 13.2 $cm^2$ $V^{-1}s^{-1}$ and a carrier concentration of $2.2 \times 10^{21}$ $cm^{-3}$. The sheet resistance was measured to be 3 Ω/□. The film thickness was kept around 600 nm to get a lower sheet resistance without degrading the transmittance much. The $MoO_x/ZnGa_{0.05}O$ bilayer films had n-type conductivity and the values of resistivity, carrier concentration and Hall mobility of these films are summarized in Table I above. The Hall measurement data (from Table I) indicates that although the carrier concentration did not change much from single layer to bilayer, the Hall mobility decreased from 13.2 to 7 $cm^2$ $V^{-1}s^{-1}$. This may be related to the grain structure of the thin $MoO_x$ layer and the interface scattering effect between the $MoO_x$ layer and the $ZnGa_{0.05}O$ layer. The grain barriers or other structural defects significantly affect the carrier transport in thin films.

As the deposition temperature was increased to 400° C., the $MoO_x/ZnGa_{0.05}O$ bilayer film showed a lower resistivity value. The resistivity is inversely proportional to the product of the carrier concentration and mobility. The decrease in resistivity may be attributed to the effective increase in the carrier concentration at higher deposition temperatures (Table I above). This high carrier concentration of the film is in agreement with the optical transmittance data, which shows a blue shift in the absorption edge. At higher temperature, more impurities will be ionized leading to an increase in carrier concentration. However, the mobility remained almost the same (8 $cm^2$ $V^{-1}$ $s^{-1}$) with an increase in the deposition temperature.

Figure 11:
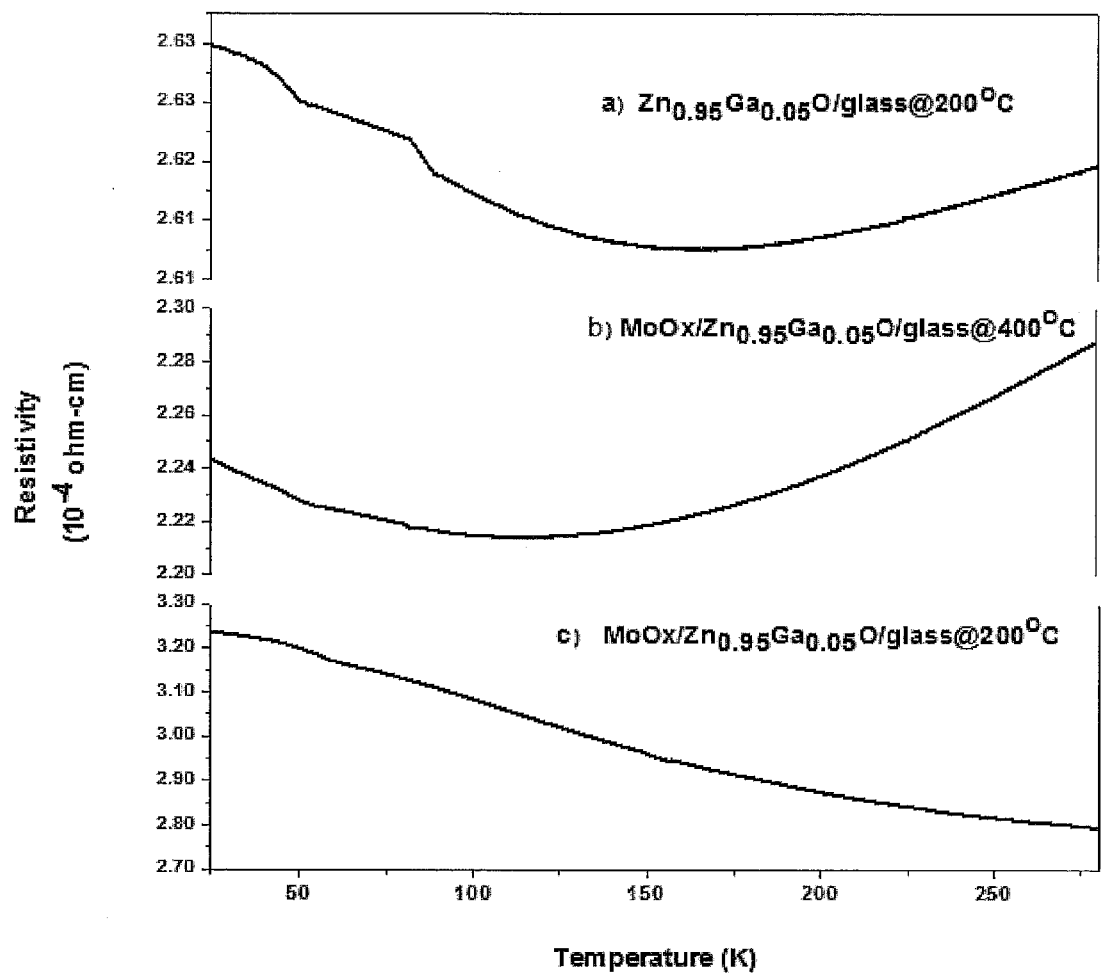
FIG. 11 is a plot of resistivity vs. temperature for (a) $Zn_{0.95}Ga_{0.05}O$ films deposited at 200° C.; (b) $MoO_x/Zn_{0.95}Ga_{0.05}O$ films deposited at 400° C.; and (c) $MoO_x/Zn_{0.95}Ga_{0.05}O$ films deposited at 200° C.

FIG. 11 shows the temperature dependence of resistivity for the $ZnGa_{0.05}O$ and $MoO_x/ZnGa_{0.05}O$ bilayer films The $ZnGa_{0.05}O$/glass composite showed metal-like behavior above 168K as shown in FIG. 11(a). The metallic conductivity can be explained by the formation of a degenerate band appearing in heavily doped semiconductors. Similar behavior was observed and reported in earlier work. See Bhosle et al., Appl. Phys. Lett. 88, 032106 (2006). This miscellaneous behavior of negative TCR (temperature coefficient of resistance) up to a certain temperature, followed by positive TCR, is governed by the two competing phenomena of mobility and carrier concentration variation with temperature. The $MoO_x/ZnGa_{0.05}$ O bilayer film grown at 400° C. also showed a similar kind of metallic behavior above 113K as shown in FIG. 11(b). Surprisingly, the $MoO_x/ZnGa_{0.05}O$ bilayer film deposited at 200° C. showed semiconducting behavior down to room temperature as shown in FIG. 11(c). This behavior can be attributed to the $MoO_x$ layer's contribution to the effective resistivity.

Figure 12:
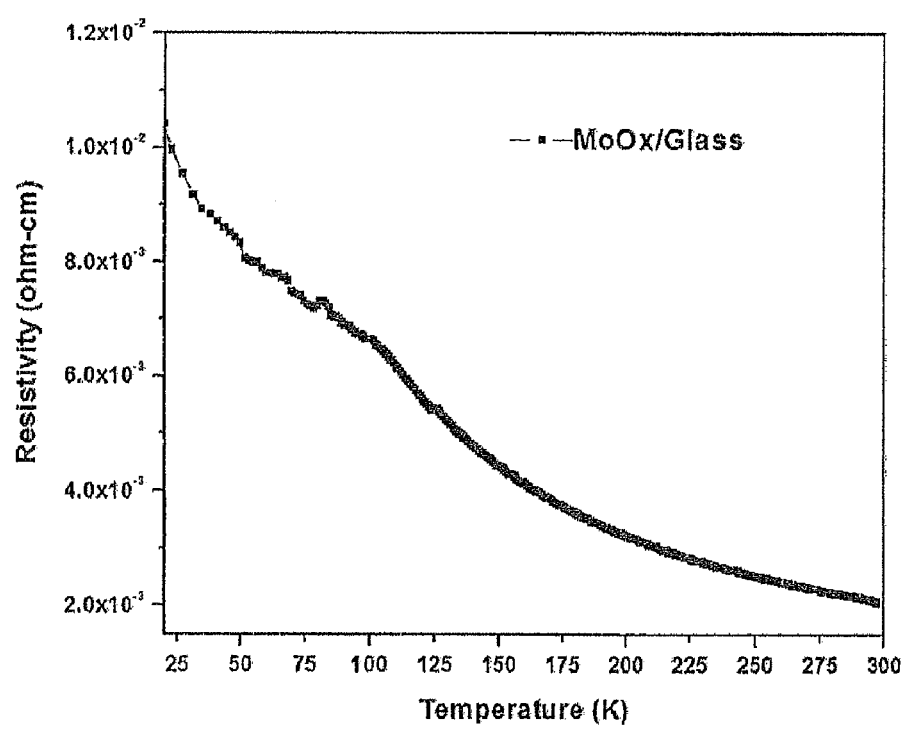
FIG. 12 is a plot of resistivity vs. temperature of $MoO_x$ on glass substrate at $T_s$ of 200° C. and $1\times10^{-3}$ Torr of oxygen pressure.

FIG. 12 shows the temperature dependence of resistivity for the thin $MoO_x$ film on glass deposited at 200° C. This film was deposited for the same time as in the case of the bilayer film. It can be observed that this film showed semiconducting behavior with a room temperature resistivity of $2 \times 10^{-3}$ Ω-cm, which is one order of magnitude higher than $ZnGa_{0.05}O$. The effective sheet resistance and resistivity is assumed to result from the resistivities of single layers coupled in parallel. Though the sheet resistance and effective resistivity of the bilayer will be dominated by the thicker layer of $ZnGa_{0.05}O$ and most of the current should pass through it, some series combinational effect does occur because of the electrical contact configuration affecting the overall resistivity as well as effective mobility.

Figure 13:
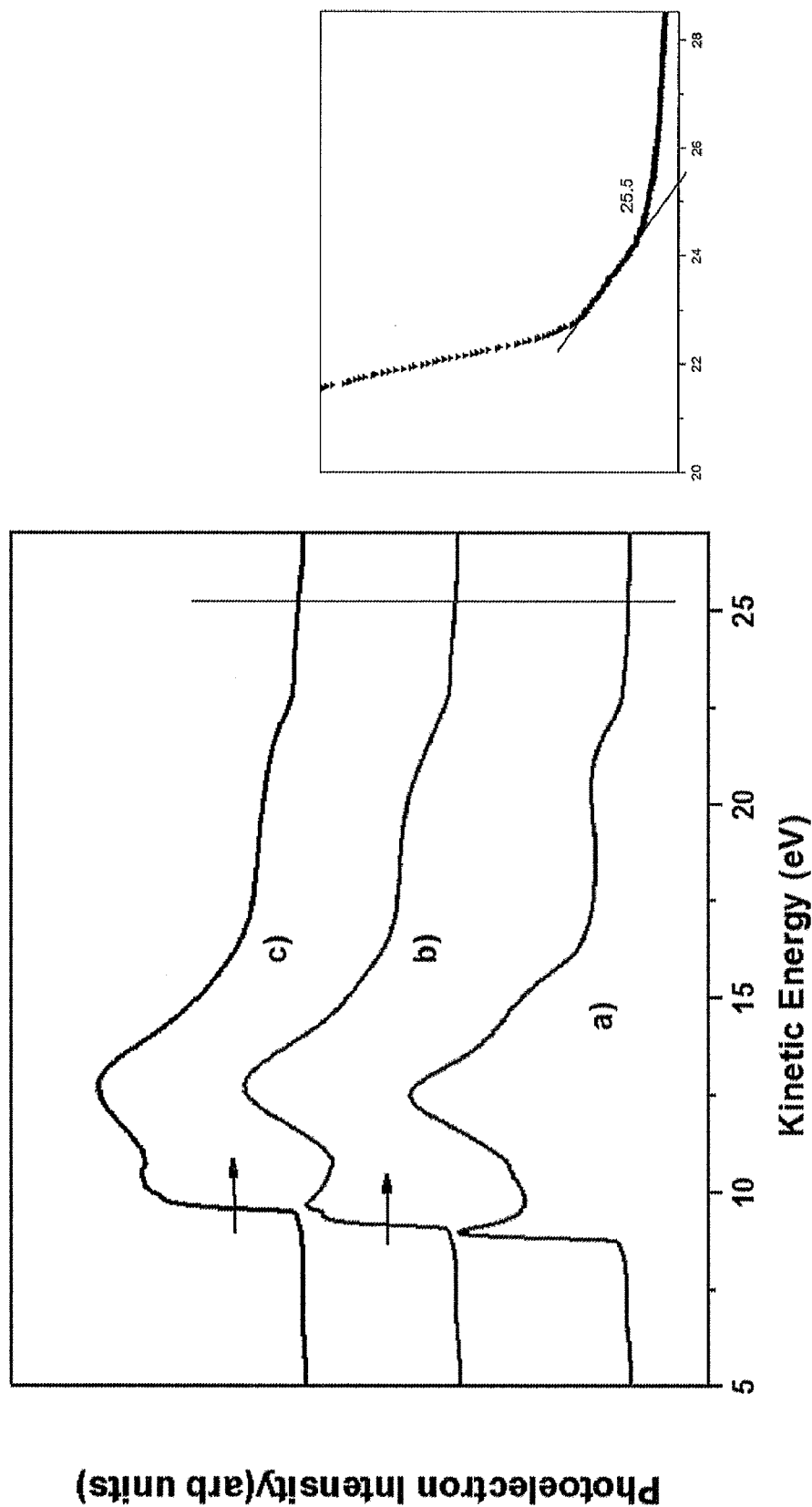
FIG. 13 is a plot of UPS spectra of (a) $Zn_{0.95}Ga_{0.05}O$ film on glass at $T_s$ 200° C.; (b) $MoO_x/Zn_{0.95}G_{0.05}O$ film on glass at $T_s$ 200° C.; and (c) $MoO_x/Zn_{0.95}Ga_{0.05}O$ film on glass at $T_s$ 400° C.

The effective work functions of these modified surfaces of $ZnGa_{0.05}O$/glass are determined by UV-photoelectron spectroscopy, using an He (I) excitation source (21.2 eV). FIG. 13 compares ultraviolet photoelectron spectroscopy (UPS) spectra of $ZnGa_{0.05}O$/glass and surface-modified $ZnGa_{0.05}O$ ($MoO_x/ZnGa_{0.05}O$) at two different conditions. The work function ($\Phi_{zgo}$) of all the samples is determined by the difference between the width of the photoemission spectrum and the source energy:

$$\Phi_{zgo} = 21.2 \text{ eV} - t, \qquad (3)$$

where t is the difference between the Fermi edge energy, $E_f$, and the lowest kinetic energy edge of the UPS spectra. See Armstrong et al., Thin Solid Films, 445, 342 (2003). The Fermi energy cutoff for the $ZnGa_{0.05}O$ film is shown in the inset of FIG. 13. It is revealed from the UPS spectra that the lowest kinetic energy edge for the bilayer films of $MoO_x/ZnGa_{0.05}O$/glass shift towards higher energy, resulting in higher effective work functions than the $ZnGa_{0.05}O$/glass films The work function values with the effective $MoO_x$ layer thickness on $ZnGa_{0.05}O$ layer are summarized in Table II below.

TABLE II

Values of work function determined from UPS spectra for different growth conditions.

| | $MoO_x$ layer thickness | Work function (eV) |
|---|---|---|
| $Zn_{0.95}Ga_{0.05}O$ ($T_S$-200° C.) | 0 nm | 4.4 |
| $MoO_x/Zn_{0.95}Ga_{0.05}O$ ($T_S$-200° C.) | ~0.9 nm | 4.7 |
| $MoO_x/Zn_{0.95}Ga_{0.05}O$ ($T_S$-400° C.) | ~1.5 nm | 5.1 |

The highest work function of 5.1 eV is achieved for the bilayer film grown at 400° C. The corresponding XPS spectra of the bilayer films $MoO_x/ZnGa_{0.05}O$/glass at deposition temperatures of 200° C. and 400° C. are shown in FIGS. 6(a) and 6(d), respectively. This work function data is consistent with the XPS and TEM data. It is evident from the XPS data (FIGS. 6(a) and 6(d)) as well as the cross-section TEM data that a thicker $MoO_x$ layer is grown at higher temperature (400° C.). Thus, the higher work function from the bilayer surface may be attributed to the grain structure of the $MoO_x$ layer. This UPS data suggests that the work function of the $ZnGa_{0.05}O$/glass can be improved by coating it with a thin $MoO_x$ layer, and that this work function can be further tuned by changing the growth parameters.

In this Example, it was found that the bilayer film ($MoO_x/ZnGa_{0.05}O$) on glass at a deposition temperature of 400° C. and $1 \times 10^{-3}$ Torr of oxygen pressure showed lowest resistivity, $2.2 \times 10^{-4}$ Ω-cm, with an optimum transmittance of 80% and a sheet resistance of 2.5 Ω/□. This film showed metallic behavior in resistivity measurements and had a higher carrier concentration of $2.9 \times 10^{21}$ $cm^{-3}$. In addition, this film showed a higher work function of 5.1 eV. The thickness of the $ZnGa_{0.05}O$ (~600 nm) seems to be optimum for the desired value of sheet resistance and transmittance. However, the $MoO_x$ layer thickness can be varied further to study in depth the effect of thickness on the surface work function, and a correlation between its mixed valence states and its work function property can be established. The properties of $MoO_x$ can be altered by annealing in air as the corresponding ratio of ($Mo^{4+}$, $Mo^{5+}$) to $Mo^{6+}$ can be varied. See Bhosle et al., *J. Appl. Phys.* 97, 083539 (2005). Thus, the bilayer films can be optimized further by changing the processing conditions and annealing the films in different ambient to obtain higher mobilities without degrading other desirable properties.

To summarize this Example, we have grown $ZnGa_{0.05}O$ films with a very thin (~1-2 nanometers) $MoO_x$ top layer on glass and sapphire substrates at different conditions by the PLD technique, and investigated the effect of the $MoO_x$ layer on the physical properties of the bilayer film All the films deposited on glass were highly oriented. This preferred (0001) orientation was due to the lowest surface energy of the basal plane and the high energy of the ablated species. Excellent crystalline quality was found in the growth temperature range of 200° C. to 400° C. From TEM results, 2-D (2-dimensional) growth mode of $MoO_x$ on $ZnGa_{0.05}O$ was observed. Different transport behavior of the $MoO_x$/$ZnGa_{0.05}O$ films on glass was observed at different $T_s$. The film at lower temperature $T_s$~200° C. showed semi-conducting behavior, whereas the film at $T_s$~400° C. showed metallic behavior beyond 113K. The bilayer films possessed good transparency ($\geqq$80%) and showed a resistivity of ~$2\times10^{-4}$ Ω-cm. It was found that as $T_s$ increases, there is a slight increase in carrier concentration and the film showed lowest resistivity and lower sheet resistance values (~2.5 Ω/□). A significant observation was that the $ZnGa_{0.05}O$ films with the ultra thin (~1-2 nanometers) $MoO_x$ overlayer showed a higher work function as compared to the single-layer $ZnGa_{0.05}O$ film. The highest work function of 5.1 eV is achieved for the bilayer film grown at 400° C. A correlation between the surface work function and the $MoO_x$ layer thickness is observed. On the basis of the demonstrated results, it is suggested that the work function of this composite TCO can be tuned by changing the deposition parameters and/or thickness of the $MoO_x$ layer. Thus, by using a thin overlayer of $MoO_x$ on $ZnGa_{0.05}O$, a higher work function can be achieved without affecting the overall transmittance and sheet resistance. Therefore, these experiments demonstrate promising results for the $MoO_x$/$ZnGa_{0.05}O$ bilayer films deposited on glass, which may be utilized as transparent electrodes in OPVs and other optoelectronic and microelectronic devices of the organic, inorganic and hybrid types.

EXAMPLE 2

The following Example reports on the properties of <0001> textured nanocrystalline $Zn_{0.95}Ga_{0.05}O$ films deposited on glass, and demonstrates that power conversion efficiencies of >1% can be achieved using these $Zn_{0.95}Ga_{0.05}O$ films as the anode for a double heterojunction OPV cell. Significantly, the comparative studies showed that these values of power conversion efficiency are comparable to the ITO-based control devices. These results are quite exciting as the power conversion efficiency of the OPV cells fabricated using ZnGaO anodes can be further increased by optimizing the organic layer structures so as to accommodate the differences in the surface characteristics of transparent electrodes. Low resistivity ZnGaO films have been prepared by systematically investigating the effect of the deposition conditions, namely the substrate temperature and the oxygen partial pressure. One observation is that the films with lowest resistivity also show metallic conductivity. The main goal of the study in this Example was to evaluate the suitability of these films for OPV applications, and to correlate device performance with the film microstructure, properties and the interface characteristics. Hybrid organic/inorganic interfaces were characterized in detail as they play a critical role in the device characteristics. To evaluate the suitability of Ga:ZnO films for solar cell applications, two cells were compared directly, one utilizing a conventional ITO anode and the other utilizing a $Zn_{0.95}Ga_{0.05}O$ anode. The present study provides a significant step forward in the advancement of alternative TCO films for transparent electrode applications, specifically for the organic solar cells.

Gallium-doped ZnO films were grown on optical grade glass substrates by pulsed-laser deposition (PLD). A pulsed KrF excimer laser with a wavelength of 248 nm, an energy density of from 4 to 7 J/cm$^2$, and a 10 Hz repetition rate was utilized for ablation of a ZnO target doped with 5 at. % Ga. The chamber had a base pressure of $10^{-6}$ Torr, and the films were deposited at oxygen partial pressures of $10^{-2}$, $10^{-3}$ and $10^{-5}$ Torr. The substrate temperature was varied from room temperature to 400° C.

For x-ray diffraction (XRD), θ-2θ scans of the films were carried out using a Rigaku x-ray diffractometer with Cu K$_\alpha$ radiation (wavelength, λ=1.54 Å) and a Ni filter. A field emission transmission electron microscope (TEM) with a Gatan Image Filter (GIF) was utilized for structural characterization. Chemical analysis of the films was done using X-ray photoelectron spectroscopy (XPS) using a Mg K$_\alpha$ X-ray source with analysis performed by deconvolution using the Shirley routine and Casa software. Electrical resistivity of the films was measured utilizing a four point probe, and the carrier concentration and mobility were determined from Van der Pauw Hall measurements.

Organic solar cells were fabricated utilizing copper phthalocyanine (CuPc) as the donor, and the fullerene C$_{60}$ as the acceptor grown on top of the TCO by organic vapor phase deposition (OPVD). Prior to loading in the deposition chamber, $Zn_{0.95}Ga_{0.05}O$ (ZnGaO) films were cleaned using deionized (DI) water, acetone and iso-propanol, and then were treated in UV-ozone for 10 minutes. The solar cell was completed by deposition of the exciton blocking layer 2,9-dimethyl-4,7-diphenyl-1,10-phenanthroline (BCP) and a Ag cathode through a shadow mask with 1 mm diameter openings. The base pressure in the OPVD growth chamber was maintained at <90 mTorr, whereas the BCP and Ag layers where grown in a chamber with a base pressure of less than $2\times10^{-7}$ Torr.

Device current density versus voltage (J-V) characteristics were measured under simulated AM 1.5G solar illumination using an HP4155B semiconductor parameter analyzer. The external quantum efficiency (EQE) was measured according to ASTM standard, "Standard Test Methods for Measuring Spectral Response of Photovoltaic Cells," vol. E 1021-95: ASTM international, 1 (2001) from which the spectral-calibrated power conversion efficiency is calculated. The structure of the interface in these devices was studied by high-resolution TEM and electron energy loss spectroscopy (EELS).

Figure 14:
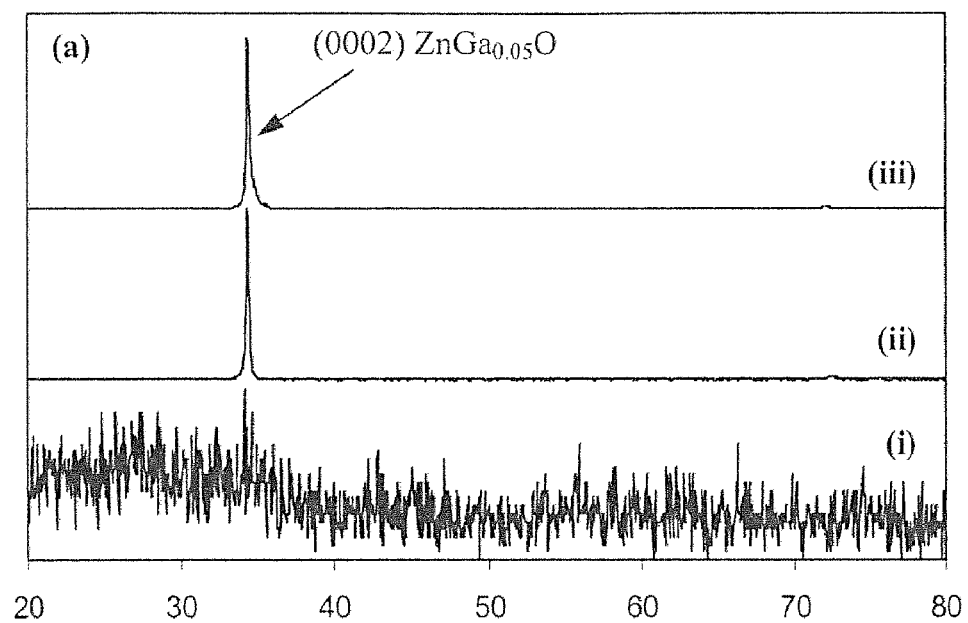
FIG. 14(a) is an X-ray diffraction pattern of $Zn_{0.95}Ga_{0.05}O$ film deposited on glass at different temperatures: (i) room temperature, (ii) 200° C., and (iii) 400° C.
FIG. 14(b) is a HRTEM micrograph of the ZnGaO/glass interface. The inset in FIG. 14(b) is a selected area electron diffraction (SAED) pattern of the interface. The spotty pattern indicates a crystalline structure with a small amount of misorientation indicated by the arcs.
Figure 14:
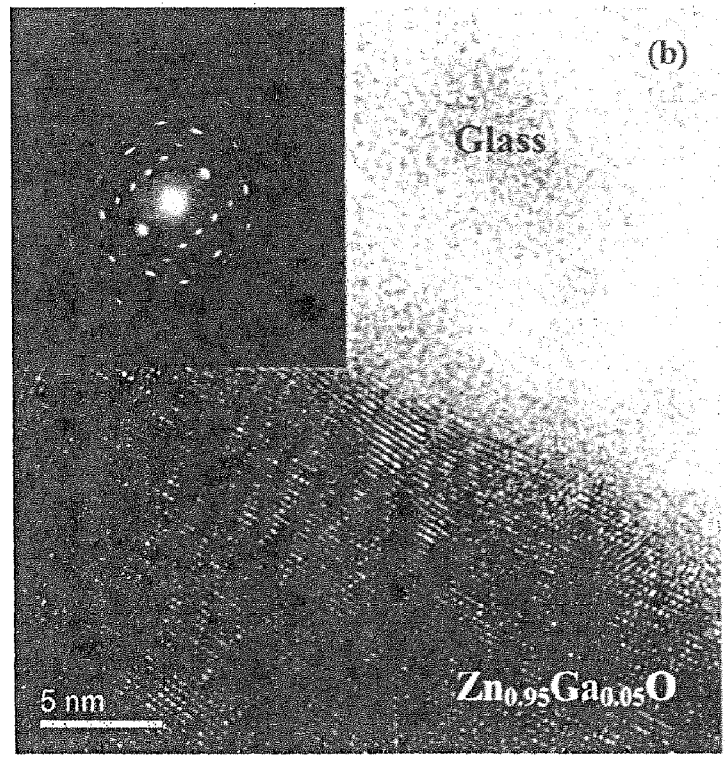

FIG. 14(*a*) shows the X-ray diffraction patterns for $Zn_{0.95}Ga_{0.05}O$ films deposited at different temperatures. The sharp (0002) ZnGaO peaks observed for the films deposited at elevated temperatures suggest the formation of highly textured (oriented along a single axis) and single phase films. The textured nature of these films is confirmed by the presence of arcs observed in the selected area electron diffraction (SAED) pattern shown as an inset in FIG. 14(*b*).

FIG. 14(*b*) is a high-resolution transmission electron microscopy (HRTEM) image of the interface between the ZnGaO film and the glass substrate. The interface is sharp with no evidence for interfacial reactions, which can occur as a result of extensive interdiffusion between the glass substrate and the film. The HRTEM image also illustrates well-aligned stacking of the (0002) planes with very little misorientation, which suggests a fair degree of order and is in good agreement with the diffraction results. In the case of the film deposited at room temperature a diffuse peak is observed, which suggests that the nanocrystalline structure has developed in this sample. From plan view TEM images, the average grain size is determined to be 10 nm, 20 nm, 30 nm for the films deposited at room temperature (RT), 200° C. and 400° C., respectively. The films deposited at elevated substrate temperatures show preferential alignment along the [0001] orientation. This is attributed to the high energy of the ablated species and the low surface energy associated with the basal plane. XPS analysis shows that the Ga concentration is close to 5%, which is characteristic of PLD where the target chemistry is preserved. The ZnGaO film deposited at 200° C. and at a partial pressure of $10^{-3}$ Torr has the lowest resistivity, about $2.0 \pm 0.2 \times 10^{-4}$ $\Omega$-cm, with a transmittance (% T) of >85% across the visible region. The Hall carrier concentration and mobility of the film is $5.7 \pm 0.1 \times 10^{20}$ cm$^{-3}$ and $13.1 \pm 0.1$ cm$^2$/Vs, respectively.

Figure 15:
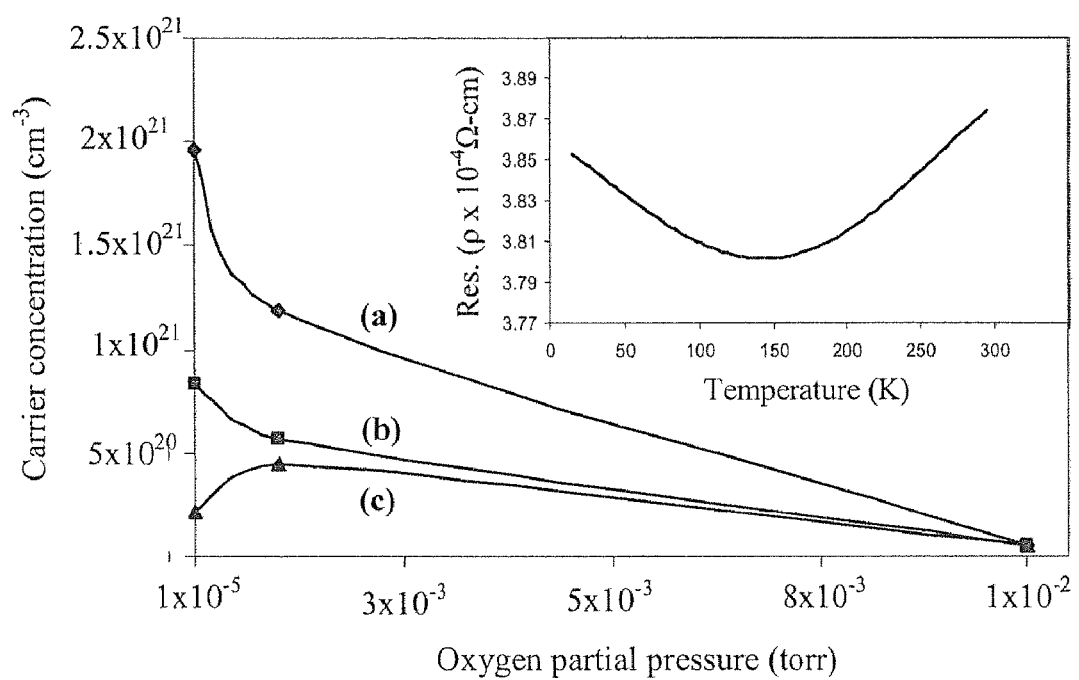
FIG. 15 is a plot illustrating the effect of oxygen partial pressure on carrier concentration of the ZnGa$_{0.05}$O films deposited on glass at different substrate temperatures: (a) RT, (b) 200° C. and (c) 400° C. The inset of FIG. 15 shows the plot of ρ vs T for the film deposited at 400° C.

The variation of carrier concentration as a function of oxygen partial pressure in the films deposited on glass at different temperatures is shown in FIG. 15. The variation of carrier concentration is attributed to the presence and stability of defects. See V. Bhosle and J. Narayan, *J. Appl. Phys.* 100, 93519 (2006). Although the films deposited at room temperature have a higher carrier concentration, the conductivity is actually lower because of their low mobilities $(4.9 \pm 0.1)$ cm$^2$/Vs. The low mobility of these films is attributed to the increased ionized impurity scattering and enhanced grain boundary scattering due to the random orientation of grains. Thus the low resistivity observed for films deposited at 200° C. is a result of the combination of reduced scattering and sufficiently high carrier concentration. Alignment of grains in the films deposited at higher temperature also leads to low angle grain boundaries, which reduces scattering, and hence the series resistance. See V. Bhosle and J. Narayan, *J. Appl. Phys.* 100, 93519 (2006); Bhosle et al., *J. Appl. Phys.* 100, 033713 (2006). The Ga:ZnO films with low resistivities showed metallic conductivity and a metal-semiconductor transition (MST) at lower temperatures, as seen in the inset in FIG. 15. The MST observed at lower temperatures has been related to the weak localization of degenerate electrons induced by the multiple scattering of free electrons by impurity atoms. See Bhosle et al., *J. Appl. Phys.* 100, 033713 (2006).

Figure 16:
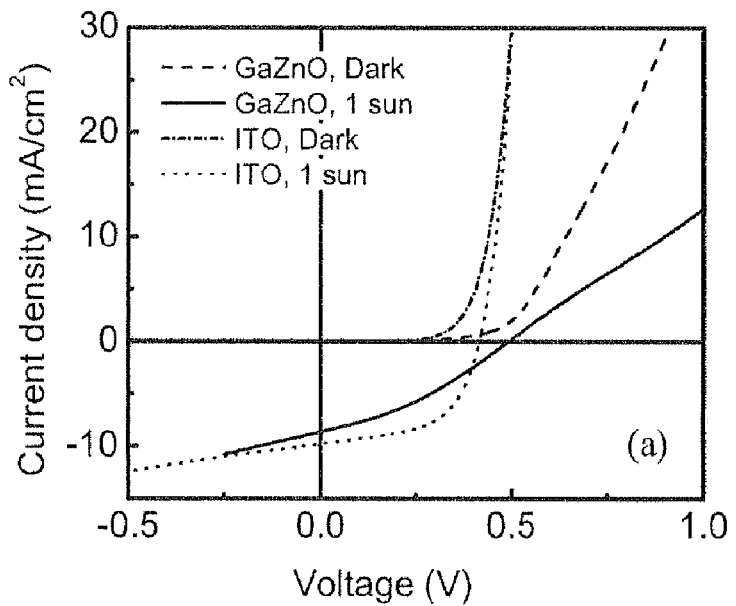
FIG. 16(a) is a plot of current density vs. voltage characteristics of ZnGaO/CuPc/C$_{60}$/BCP/Ag and ITO/CuPc/C$_{60}$/BCP/Ag solar cell devices in the dark and at 1 sun (100 mW/cm$^2$) simulated AM 1.5G irradiance.
FIG. 16(b) is a plot of external quantum efficiency (EQE) spectra of the ZnGaO/CuPc/C$_{60}$/BCP/Al solar cell and a comparison with the AM 1.5 solar emission spectra.
Figure 16:
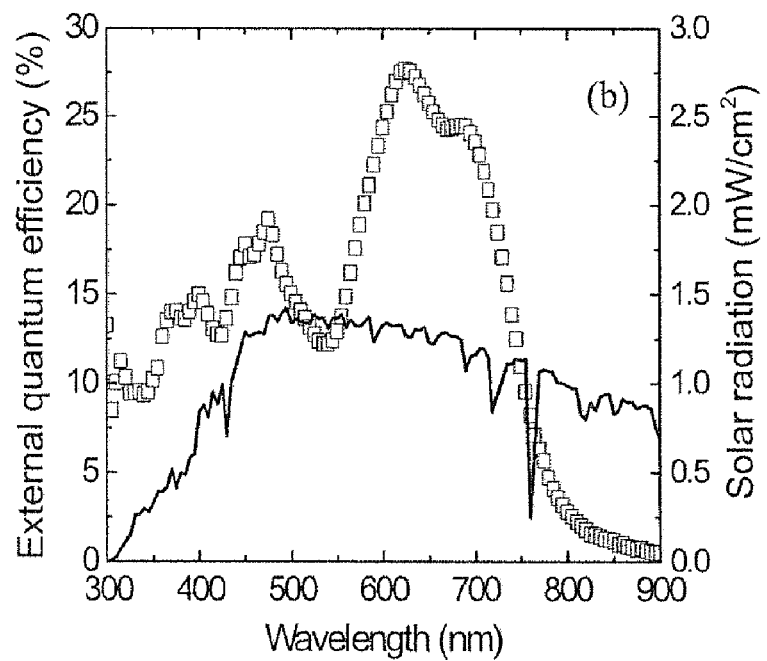

The deposition parameters associated with the lowest resistivity ZnGaO film (e.g., 200° C., $10^{-3}$ Torr) were employed to prepare the anode in a solar cell with the following structure: ZnGaO/CuPc (350 Å)/C$_{60}$ (375 Å)/BCP (100 Å)/Ag (1000 Å). FIG. 16(a) shows the J-V characteristics in the dark and under illumination for the solar cell with the ZnGaO anode, and a comparison with an ITO/CuPc (145 Å)/C$_{60}$ (500 Å)/BCP (100 Å)/Ag (1000 Å) solar cell. The lower forward current and smaller slope in the dark J-V curve of the cell grown on ZnGaO implies a higher contact resistance resulting from the smaller work function ($\phi$) of the ZnGaO films (~4.1 eV, compared to 4.8 eV for ITO). The work function of ZnGaO films was calculated by considering the shift in Fermi level associated with the increase in carrier concentration, and subsequent band filling. Values listed in Table III below show the variation of work function with carrier concentration in the films deposited under different growth conditions. The high carrier concentration and degenerate nature of the ZnGaO films leads to the lower work function in these films At 100 mW/cm$^2$, AM 1.5G, of simulated illumination the GaZnO-based solar cell has a short circuit current (J$_{SC}$) of 9 mA/cm$^2$, and a low fill factor (FF) of 0.35 at 1 sun, which is a result of the higher resistance. A slight increase of the open circuit voltage (V$_{OC}$) is observed in the GaZnO-based solar cells, which again confirms the higher contact resistance in this device.

TABLE III

Values of work function calculated from the change in carrier concentration for the films deposited under different growth conditions.

| Temperature (° C.) | Oxygen pressure (Torr) | n (cm$^{-3}$) | $\Phi$ (eV) |
|---|---|---|---|
| Glass_RT | $2.4 \times 10^{-2}$ | $5.28 \times 10^{19}$ | 4.22 |
| | $1.0 \times 10^{-3}$ | $1.19 \times 10^{21}$ | 4.14 |
| | $1.0 \times 10^{-5}$ | $1.96 \times 10^{21}$ | 4.13 |
| Glass_200 | $2.4 \times 10^{-2}$ | $5.18 \times 10^{19}$ | 4.22 |
| | $1.0 \times 10^{-3}$ | $5.71 \times 10^{20}$ | 4.16 |
| | $1.0 \times 10^{-5}$ | $8.36 \times 10^{20}$ | 4.15 |
| Glass_400 | $2.4 \times 10^{-2}$ | $4.90 \times 10^{19}$ | 4.22 |
| | $1.0 \times 10^{-3}$ | $4.50 \times 10^{20}$ | 4.17 |
| | $1.0 \times 10^{-5}$ | $2.12 \times 10^{20}$ | 4.19 |

FIG. 16(b) shows the EQE of this device with a comparison to the AM 1.5 spectrum. See National renewable energy laboratory, ASTM G-173-03, air mass 1.5 reference solar spectral irradiance, website: http://rredc.nrel.gov/solar/spectra/am1.5/. The peaks at wavelengths of $\lambda$=450, 620 and 690 nm correspond to the absorption maxima of C$_{60}$ and CuPc. The overlap of the EQE with the standard AM 1.5 solar emission spectra yields a J$_{SC}$ of 7.1 mA/cm$^2$, leading to a power conversion efficiency of 1.25$\pm$0.05%. The calculated value of J$_{SC}$ is ~20% lower than the value obtained by direct measurement and is attributed to the mismatch between the simulated and standard AM 1.5 solar spectra. The lower value of J$_{SC}$ also leads to a lower value of power conversion efficiency. Nevertheless, this value of efficiency can be further increased by optimizing the thickness and the structure of the organic layers so as to accommodate the differences in the surface characteristics (roughness and work function) of ZnGaO films.

Figure 17:
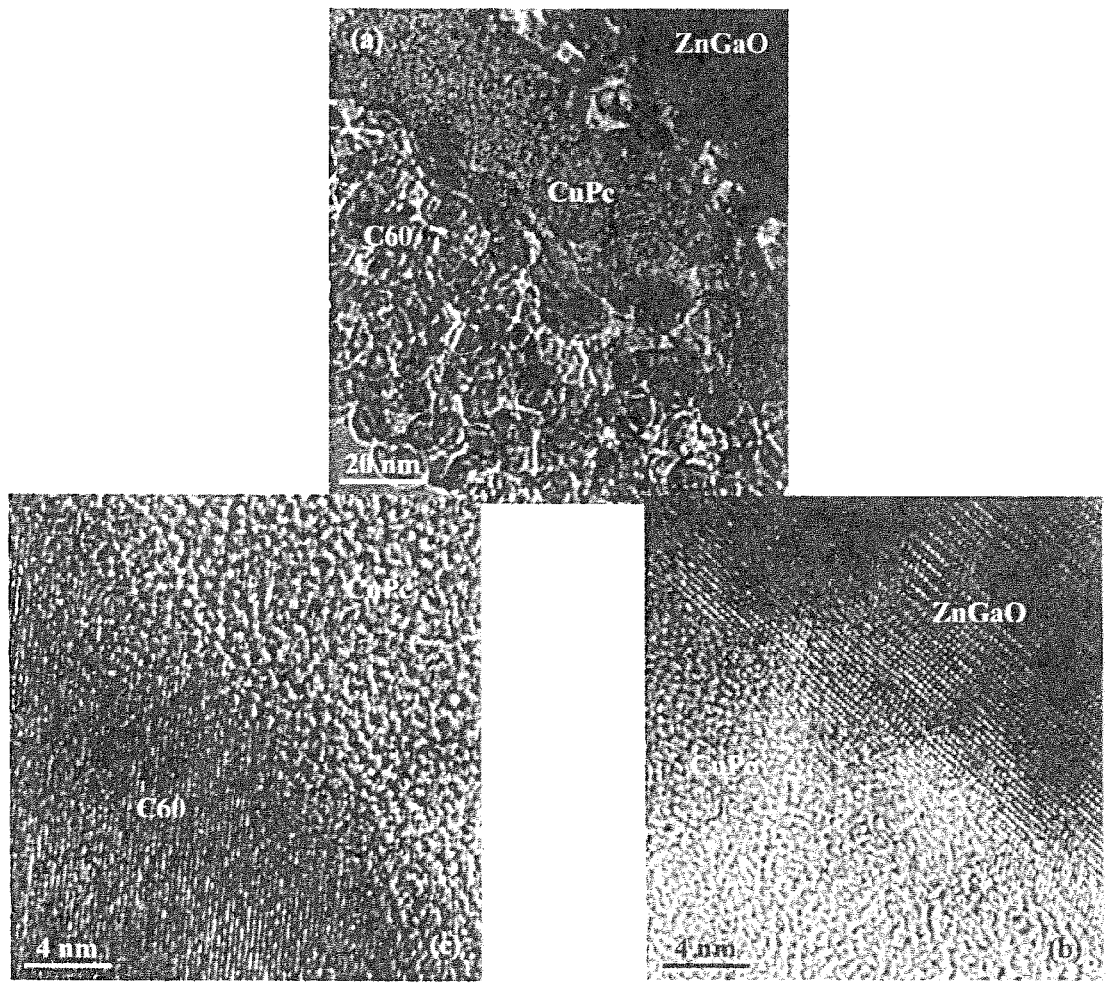
FIG. 17(a) is a low magnification transmission electron micrograph (TEM) of a C$_{60}$/CuPc/ZnGaO structure.
FIG. 17(b) is a HRTEM micrograph of the C$_{60}$/CuPc interface.
FIG. 17(c) is a HRTEM image of the CuPc/ZnGaO interface.

FIG. 17(a) is a low magnification TEM cross-sectional image of the C$_{60}$/CuPc/ZnGaO layers. The thicknesses of the CuPc and C$_{60}$ layers are 30 nm and 45 nm, respectively. The C$_{60}$ layer has a nanocrystalline structure, with crystallite sizes varying from 4 to 10 nm. FIG. 17(b) shows a sharp CuPc/ZnGaO interface with no indication of interfacial reaction. The micrograph reveals the formation of a uniform bond between the CuPc and the nanocrystalline ZnGaO film FIG. 17(c) shows that the interface between the two organic layers (C$_{60}$ and CuPc) is relatively abrupt as well. The image of the C$_{60}$ layer shows arrays of the atomic planes, suggesting that the C$_{60}$ nanoparticles are indeed crystalline.

To summarize this Example, we have grown conducting and transparent Ga-doped ZnO films on glass substrates by PLD. Structural analyses showed that the Zn$_{0.95}$Ga$_{0.05}$O films are nanocrystalline with a grain size <40 nm, preferentially oriented along the (0001) axis. When inserted as anodes in OPV cells, the structures have a resistivity of $2 \times 10^{-4}$ $\Omega$cm and >85% transparency across the visible spectrum. By understanding the relationship between the film properties, microstructure, and processing parameters, it is found that ZnGaO films with metallic conductivity at ambient temperatures can be synthesized. Efficiencies comparable to ITO-based OPV cells can be achieved using Zn$_{0.95}$Ga$_{0.05}$O films as the anode. The optimal growth temperature for the ZnGaO films is ~200° C. Cross-sectional TEM analysis of the OPV device structure did not reveal the presence of inhomogeneities at the organic/inorganic interface. A $V_{OC}$=0.50 V and power efficiency of 1.25±0.05% achieved for non-optimized device structures with ZnGaO anodes suggests that these TCO layers have potential as a substitute for ITO. These results represent a significant step forward in the advancement of alternative TCOs for transparent electrode applications in organic solar cells.

In addition, by comparing the results of Example 2 with those of Example 1 (and Example 3, below), it can be seen that the TCO disclosed herein, which includes the $MoO_x$ or $NiO_x$ on ZnO structure, provides numerous improvements over the ZnO-based TCO lacking the $MoO_x$ or $NiO_x$ overlayer, including higher work function, superior diffusion barrier characteristics, and improved carrier transport across the electronic junctions of microelectronic devices. For instance, in one specific case described above, that of the OPV device, the use of the $MoO_x$-inclusive TCO as the anode significantly improves the power conversion efficiency of the device. The present disclosure therefore demonstrates that the ($MoO_x$, $NiO_x$)/ $ZnGa_{0.05}O$ material system is a functionally and commercially viable alternative to ITO-based TCOs.

EXAMPLE 3

The following Example reports on the growth of a heterostructure consisting of thin overlayer of p-type $NiO_x$ on Ga-doped ZnO (GZO) film by PLD. Due to the non-equilibrium nature of PLD growth technique, the defect concentration and non-stoichiometry of $NiO_x$ could be tuned by optimizing the deposition parameters (partial pressure of oxygen ($PO_2$), substrate temperature and $O_2$ nozzle placement with respect to the laser plume). We have also grown p-type Li (5 at %) doped NiO as an overlayer to further decrease the resistivity of the NiO so that the interfacial power losses could be minimized The experimental results involving optical, structural, chemical (bonding state), electrical property and work-function measurements of $NiO_x/ZnGa_{0.05}O$ and $Li_{0.05}NiO/ZnGa_{0.05}O$ bilayers are presented below. This example also establishes correlations between the processing parameters, the structure and properties of the bilayer films for transparent electrode applications. The effect of varying the $NiO_x$ thickness on the electrical and optical properties of $NiO_x/ZnGa_{0.05}O$ bilayer films has also been investigated.

Ga-doped ZnO (GZO) films with a thin $NiO_x$ overlayer were grown on c-plane (0001) sapphire substrates as well as amorphous glass substrates. To enhance the room temperature conductivity of the interfacial layer between the organic layer and the anode (in a device fabricated for this Example), $NiO_x$ doped with $Li^+$ (5 at %) was also deposited as an overlayer. A pulsed KrF excimer laser of wavelength (248 nm) and pulse duration (25 ns) was used for the depositions. Optimized targets for 5 at. % of gallium-doped ZnO, NiO and $Li_{0.05}NiO$ were prepared by a conventional solid state reaction technique. The chamber was evacuated to a base pressure of $10^{-6}$ Torr prior to growth and deposition was carried out at an oxygen pressure of $\sim(1.0\text{-}4.0\times10^{-3})$ Torr to control the defects that further influence the electrical and optical properties of the film. The laser energy density was varied from 2.0-3.0 J/cm². A pulse rate of 10 Hz and 5 Hz was used for GZO and $NiO_x$, respectively. The substrate temperature was varied from 200° C.-400° C. By depositing the GZO layer for 20 minutes, a thickness of ~600±50 nm was obtained. The thickness of the $NiO_x$ layer was carefully controlled in the range of 4-25 nm by controlling the repetition rate and the number of pulses.

A Rigaku Geigerflex diffractometer with Cu $K_\alpha$ radiation ($\lambda$=1.54 Å) and a Ni filter was used for x-ray diffraction (XRD) (θ-2θ scan). The x-ray phi scan measurements were carried out by using high-resolution XRD (Philips X'Pert PRO MRD HR). The surface morphology was measured using atomic force microscope (AFM) (Dimension 3100). The XPS analysis of the films was carried out in a Riber LAS-3000 X-ray photoelectron spectrometer Al $K_\alpha$ X-ray source. The oxidation states of the elements present in the film were analyzed by deconvolution using a Shirley routine and Casa software. The values corresponding to the C 1s peak were used as a reference for the curve fitting analysis. Optical transmittance measurements were carried out as a function of wavelength in the range 200-900 nm using a Hitachi U-3010 Spectrophotometer. The electrical resistivity of the films was measured using a four-probe technique in the temperature range of 15 K-300 K. The contacts on the films were made by using indium dots on the top layer for the electrical measurements. Hall measurements were also performed on these samples using the Van der Pauw method. The UPS measurements were conducted with a Kratos Axis Ultra DLD Ultraviolet Photoelectron Spectrometer equipped with a monochromatic He ultraviolet source He I (21.2 eV). A 5-V bias was applied to enhance the extraction of low kinetic energy (K.E.) electrons and to successfully determine the energy of the low KE edge. The Fermi edge for these samples was determined after sputter-cleaning of the surface of the samples with $Ar^+$ ions for 2 minutes in UHV. The samples were mounted with Cu clips grounding the film surface to reduce the possibility of charging effect. All the samples were referenced with a clean gold sample and proper connection of the samples on the same stub ensured that the samples were in electronic equilibrium with the spectrometer.

Figure 18:
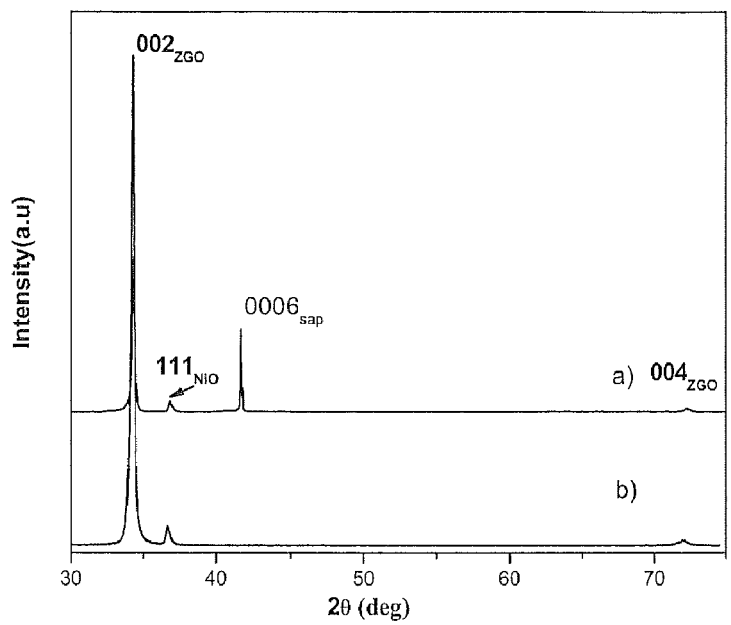
FIG. 18 is an X-ray diffraction scan (θ-2θ scan) of NiOx (25 nm)/Zn$_{0.95}$Ga$_{0.05}$O films on (a) sapphire and (b) glass substrates.

FIGS. 18(a) and 18(b) show the XRD patterns (θ-2θ scan) of bilayer film ($NiO_x$ (25 nm)/$ZnGa_{0.05}O$) grown at 200° C. on c-plane sapphire and amorphous glass substrates, respectively. The result indicates the growth of a highly oriented GZO film in the [0001] direction and a cubic NiO layer in the [111] direction normal to the film plane. The FWHM of the (0002) diffraction peaks corresponding to $ZnGa_{0.05}O$ obtained from the XRD spectra on sapphire and glass substrates are 0.23° and 0.27°, respectively. The sharp (0002) $ZnGa_{0.05}O$ peak suggests good crystalline growth both on sapphire and amorphous glass substrates at a lower temperature of 200° C. The results from earlier work along with the X-ray diffraction pattern (FIG. 18) confirm that the $ZnGa_{0.05}O$ layers grown at these temperatures on glass substrates are highly textured along the [0001] orientation. See Dutta et al., *J. Appl. Phys.* 105, 053704 (2009). It is also evident that the NiO layer shows textured growth along the [111] direction on the $ZnGa_{0.05}O$ (0001) on glass substrate (FIG. 18). The absence of additional peaks excludes the possibility of any other phases of NiO and suggests that the NiO layer has only one out-of-plane orientation on the $ZnGa_{0.05}O$ layer on both substrates. However, the NiO peak was not so prominent in the XRD pattern upon reducing the thickness of NiO overlayer. The presence of an ultrathin NiO overlayer is confirmed by the XPS measurements and will be discussed below.

Figure 19:
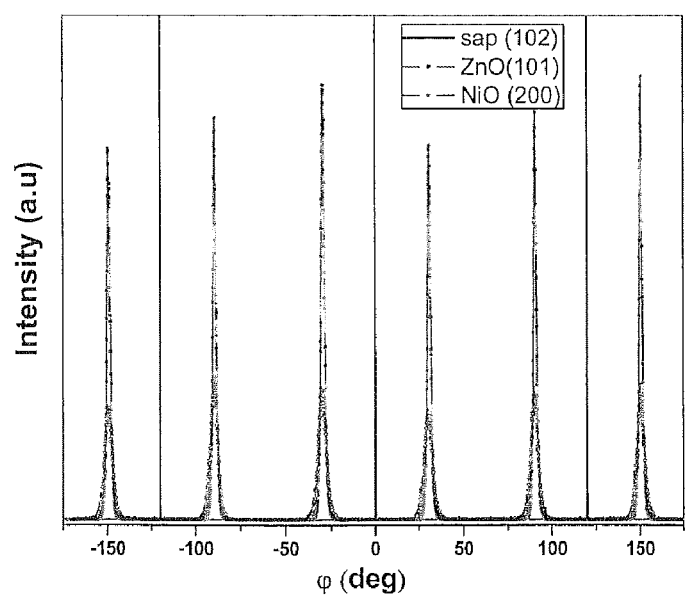
FIG. 19 is an azimuthal (Φ scan) of a NiO/ZGO/Al$_2$O$_3$ (0001) heterostructure, with ($1\bar{1}02$) reflections of sapphire, at 2θ=25.58°, and Ψ=57.61°; (101) reflections of ZGO, at 2θ=36.25°, and Ψ=61.07°; (200) reflection of NiO, at 2θ=43.28°, and Ψ=54.73°.

To obtain information about the in-plane orientation and establish the epitaxial growth of the bilayer film on sapphire substrate, high resolution x-ray diffraction studies were carried out. The Φ scan for (101) $ZnGa_{0.05}O$ planes, which are inclined at 61.07° from (0001) planes, was done with 2θ=36.25° (FIG. 19). The Φ scan result shows the six fold symmetry of $ZnGa_{0.05}O$ reflection. It can be concluded from the Φ scan that $ZnGa_{0.05}O$ grows epitaxially on [0001] $\alpha\text{-}Al_2O_3$ at 200° C. with the following orientation relationship: (a) $[0001]_{ZGO}\|[0001]_{Al2O3}$ (out of plane); (b) $[2\bar{1}10]_{ZGO}\|[10\bar{1}0]_{Al2O3}$; and (c) $[10\bar{1}0]_{ZGO}\|[21\bar{1}0]_{Al2O3}$ in plane). This epitaxial relationship is known as 30° or 90° rotation, where ZnGa$_{00.5}$O rotates by 30° in the basal c-plane of α-Al$_2$O$_3$. To obtain information about the in-plane orientations in the NiO$_x$/ZnGa$_{0.05}$O/α-Al$_2$O$_3$ heterostructure, a further (I) scan was performed for (200) NiO planes, which are inclined at 54.73° from (111) planes, and was done with 2θ=43.28° (FIG. 19). The 6-fold symmetry seen in Φ scan confirms that NiO grows epitaxially on ZnGa$_{0.05}$O. Hence, the epitaxial relationship can be written as: (a) [111]$_{NiO}$∥[0001]$_{ZGO}$ (out of plane); (b) [110]$_{NiO}$∥[2$\bar{1}$10]$_{ZGO}$; and (c) [112]$_{NiO}$∥[10$\bar{1}$0]$_{ZGO}$ (in plane). It should be noted that the work function of a material depends on the crystallographic orientation of the surface. The resulting work-function difference between two surfaces can be as high as 1 eV. Here, we are able to grow single-orientation (111) NiO on a ZGO layer, and NiO is known to have highest work-function in the (111) orientation.

Figure 20:
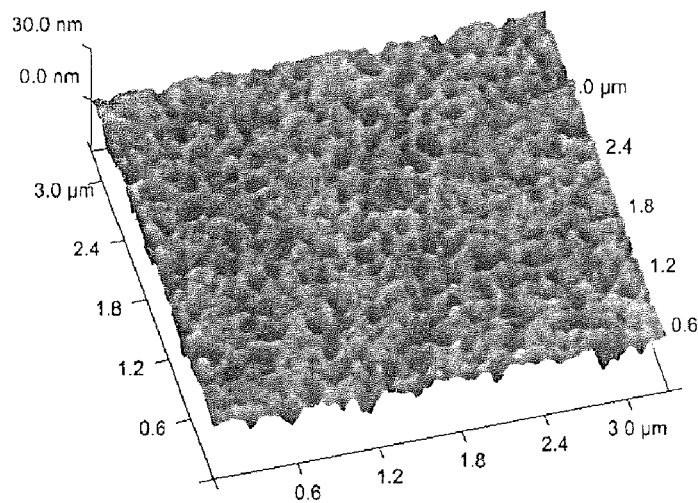
FIG. 20 provides AFM images (3×3 μm$^2$) of (a) a ZGO film and (b) a NiO$_x$ (8 nm)/ZGO bilayer film on glass substrates.
Figure 20:
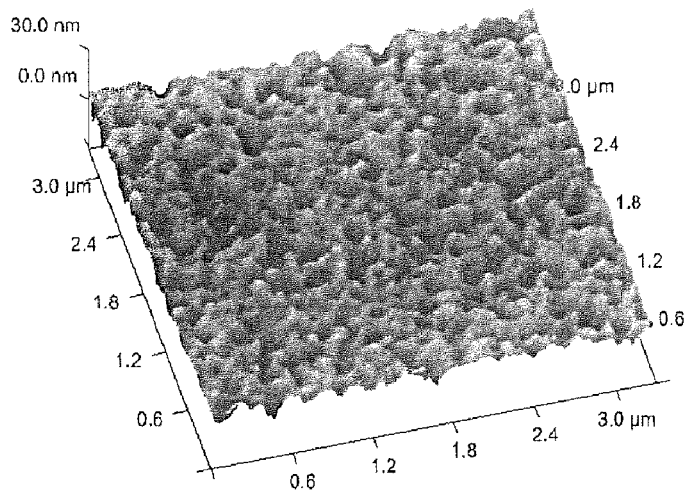

The AFM images of ZnGa$_{0.05}$O, and ZnGa$_{0.05}$O with the NiO$_x$ (8 nm) overlayer, deposited on glass substrates at a substrate temperature of 200° C. are shown in FIGS. 20(a) and 20(b), respectively. The surface morphology of the ZnGa$_{0.05}$O film shows a smooth layer with an average surface roughness (Ra)=1.76 nm The surface morphology of the ZnGa$_{0.05}$O film with an NiO$_x$ (8 nm) overlayer did not show any appreciable change and the average surface roughness (Ra) was found to be 2.05 nm. The growth mode is envisaged to be two-dimensional. It is expected that the smooth and uniform surfaces of the TCO layer will give good interface properties with the organic layer of a device.

The optical transmittance determines the incident photon absorption and the series resistance, which are the dominant factors affecting the device performance. Preliminary optimization of the NiO$_x$ overlayer in terms of film conductivity and optical transparency was done by varying the substrate temperature (T$_s$), in-growth O$_2$ partial pressure (PO$_2$) and O$_2$ nozzle placement inside the chamber in separate NiO$_x$ depositions on sapphire and glass substrates. These films were approximately 300 nm thick. The optimized NiO$_x$ layer showed a room temperature resistivity of 3 Ω-cm and optical transparency of 70%. To further increase the conductivity of the NiO$_x$ overlayer, Li$^+$ (5 at %) doped NiO$_x$ films were also prepared. The transmittance of the optimized Li$_{0.05}$NiO films in the visible region was found to be 60% and the room temperature resistivity was less than the undoped NiO$_x$ films by one order of magnitude (2×10$^{-1}$ Ω-cm). The effect of varying the NiO$_x$ thickness on the electrical and optical properties of the NiO$_x$/ZnGa$_{0.05}$O bilayer films was also investigated. The characterizations were carried out for three different thicknesses (4 nm, 8 nm and 25 nm).

Figure 21:
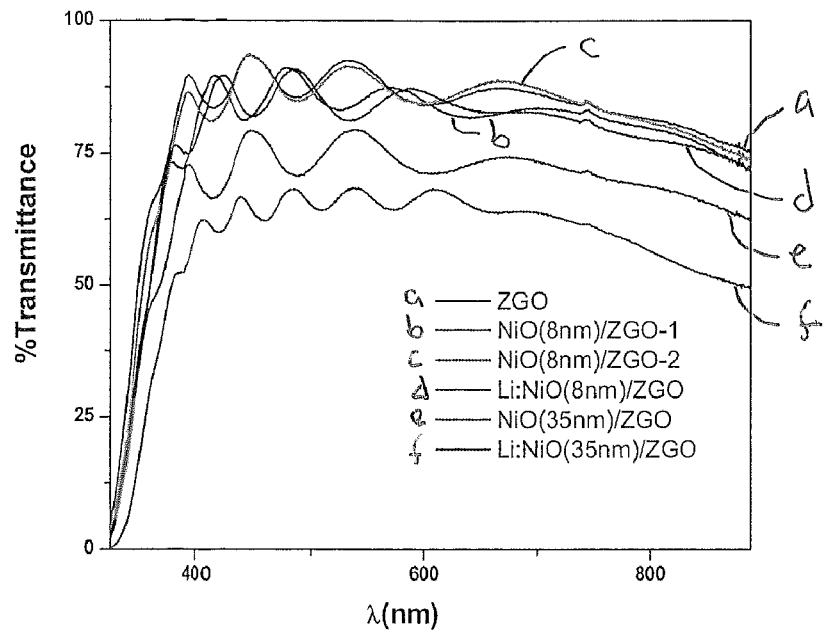
FIG. 21 is a set of comparative UV-Vis transmission spectra of the Zn$_{0.95}$Ga$_{0.05}$O and the bilayer films on glass substrates.

FIG. 21 illustrates the transmission spectra of the bilayer NiO$_x$/ZnGa$_{0.05}$O film with different NiO overlayer thicknesses and doping. Table IV below presents the average transmittance values for films at different growth conditions. Descriptions of the respective samples are presented below Table IV.

TABLE IV

Summary of electrical and optical properties for NiO$_x$/Zn$_{0.95}$Ga$_{0.05}$O films at different growth conditions and different NiO thickness.

| | NiO thickness | Rs | Hall Mobility | N | T |
|---|---|---|---|---|---|
| S1: ZGO | 0 nm | 1.8 | 17.8 | 1.1 × 10$^{21}$ | 87 |
| S2: NiO/ZGO | 4 nm | 1.9 | 16.0 | 1.1 × 10$^{21}$ | 87 |
| S3: NiO/ZGO | 8 nm | 1.8 | 16.9 | 1.2 × 10$^{21}$ | 86 |
| S4: NiO/ZGO | 8 nm | 1.7 | 18.6 | 1.2 × 10$^{21}$ | 87 |
| S5: LiNiO/ZGO | 8 nm | 1.8 | 16.4 | 1.3 × 10$^{21}$ | 88 |
| S6: NiO/ZGO | 25 nm | 1.8 | 16.8 | 1.1 × 10$^{18}$ | 79 |
| S7: LiNiO/ZGO | 25 nm | 1.7 | 16.7 | 2.1 × 10$^{18}$ | 68 |

S1: Zn$_{0.95}$Ga$_{0.05}$O
S2: NiO$_x$ (4 nm)/Zn$_{0.95}$Ga$_{0.05}$O
S3: NiO$_x$ (8 nm)/Zn$_{0.95}$Ga$_{0.05}$O (PO$_{2NiO}$ = 10$^{-3}$ Torr)
S4: NiO$_x$ (8 nm)/Zn$_{0.95}$Ga$_{0.05}$O (PO$_{2NiO}$ = 7 × 10$^{-2}$ Torr)
S5: Li$_{0.05}$NiO (8 nm)/Zn$_{0.95}$Ga$_{0.05}$O (PO$_{2NiO}$ = 7 × 10$^{-2}$ Torr)
S6: NiO$_x$ (25 nm)/Zn$_{0.95}$Ga$_{0.05}$O
S7: NiO$_x$ (30 nm)/Zn$_{0.95}$Ga$_{0.05}$O$_{0.05}$; S7: Li$_{0.05}$NiO (25 nm)/Zn$_{0.95}$Ga$_{0.05}$O It can be observed that the ZGO film (S1) shows an average transmittance of ~87% in visible region. The transmittance spectra of NiO$_x$/ZnGa$_{0.05}$O films are not degraded as compared to ZnGa$_{0.05}$O films, with the overlayer (NiO$_x$, Li$_{0.05}$NiO) thickness up to 8 nm (S2, S3 and S4). Overlayer thickness up to 8 nm should allow the maximum photon flux to reach the active layer for photo-current generation. As the thickness of the overlayer (NiO$_x$, Li$_{0.05}$NiO) is further increased to 25 nm, the transmittance of films S5 and S6 reduces to 79% and 68% respectively.

Figure 22:
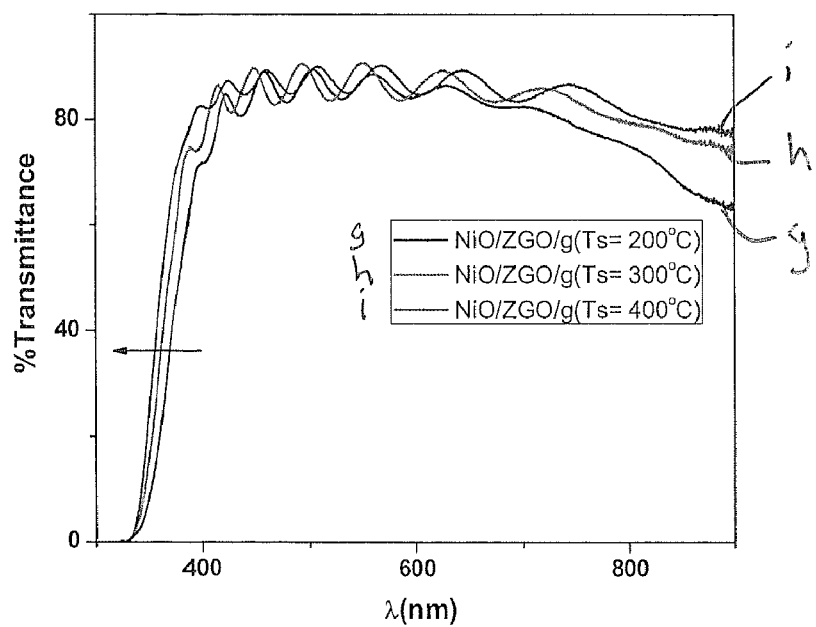

FIG. 22 illustrates the transmission spectra of the bilayer films (NiO$_x$/ZnGa$_{0.05}$O) at different substrate temperatures (T$_s$) from 200° C. to 400° C. on glass substrates. It can be observed that there is a blue shift of the absorption edge with the increase in substrate temperature (T$_s$). As noted earlier in this disclosure, the optical band gap (E$_g$) can be calculated by assuming a direct transition between valence and conduction bands, and may be determined in accordance with equations (1) and (2) set forth above.

The band gap was obtained by extrapolating the linear part of the plot (αhv)$^2$ vs hv to the energy axis. The band gap (E$_g$) of the NiO$_x$/ZnGa$_{0.05}$O film at T$_s$~200° C. is calculated to be 3.45 eV. As noted earlier in this disclosure, this widening of band-gap with the increase in substrate temperature is attributed to the Burstein-Moss effect, since the absorption edge of a degenerate semiconductor is shifted to the smaller wavelength with increasing carrier concentration.

The ZnGa$_{0.05}$O film showed a sheet resistance of 1.8 Ω/□, Hall mobility of 17.8 cm$^2$V$^{-1}$s$^{-1}$ and a carrier concentration of 1.1×10$^{21}$ cm$^{-3}$. The film thickness was kept around 600 nm to get a lower sheet resistance without degrading the transmittance. The ZnGa$_{0.05}$O films had n-type conductivity and the films are modified with p-type NiO overlayers. The values of sheet resistance, carrier concentration and Hall mobility of these bilayer films are summarized in Table IV above. The carrier concentration and Hall mobility of ZnGa$_{0.05}$O films with the overlayer (NiO$_x$, Li$_{0.05}$NiO) thickness of 8 nm (S2, S3 and S4) remain nearly same as that of ZnGa$_{0.05}$O film As the thickness of overlayer (NiO$_x$, Li$_{0.05}$NiO) is further increased to 25 nm, the effective carrier concentration of the films (S5 and S6) is significantly reduced to the order of 10$^{18}$ cm$^{-3}$. This reduction in carrier concentration could be attributed to the lower carrier concentration of p-NiO overlayer which might be affecting the overall carrier concentration.

Figure 23:
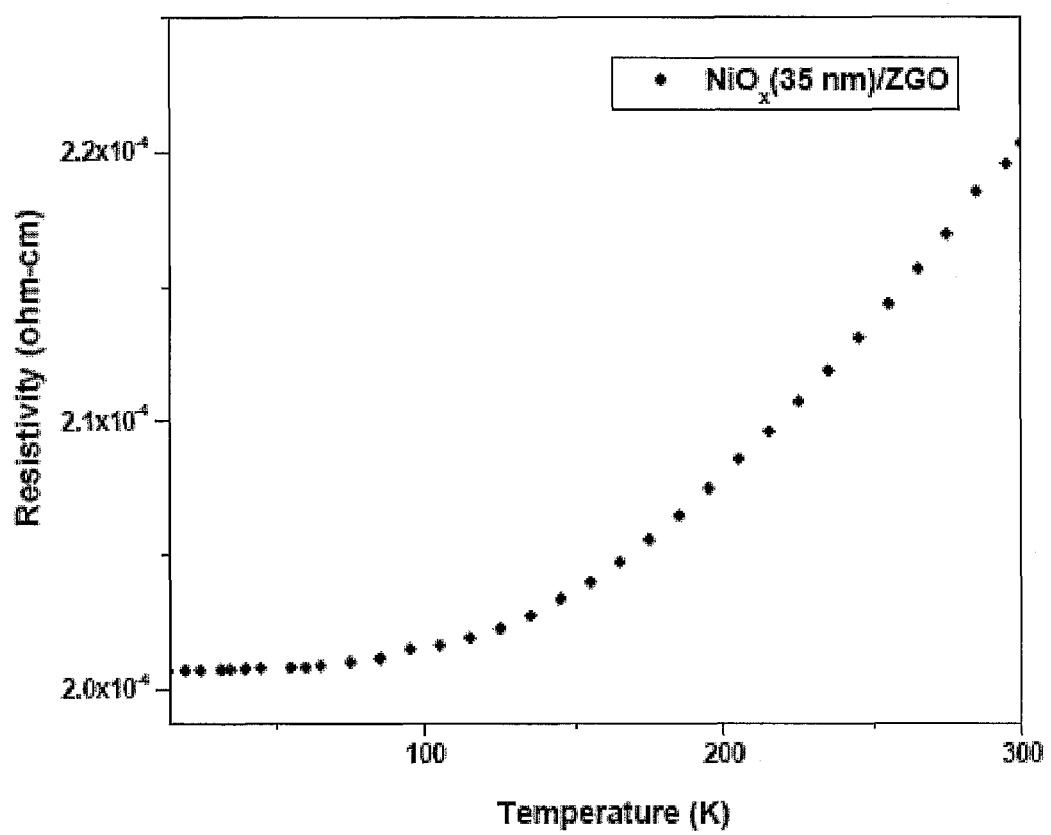
FIG. 23 is a plot of resistivity vs. temperature for a NiO$_x$ (25 nm)/Zn$_{0.95}$Ga$_{0.05}$O heterostructure film

FIG. 23 shows temperature dependence of resistivity for the NiO$_x$/ZnGa$_{0.05}$O bilayer film. The film showed metal-like conductivity behavior above 100K. The metallic conductivity can be explained by the formation of a degenerate band appearing in heavily doped semiconductors. Similar behavior was observed and reported in earlier work. See Bhosle et al., *Appl. Phys. Lett.* 88, 32106 (2006); Dutta et al., *J. Appl. Phys.*

105, 053704 (2009). The effective room temperature resistivity of the bilayer film estimated from the resistivity measurement (FIG. 23) is $2.2 \times 10^{-4}$ Ω-cm, which is of the same order as the $ZnGa_{0.05}O$ film The effective sheet resistance and resistivity measured by the four probe technique are assumed to result from the resistivity of single layers coupled in parallel. It is envisaged that the sheet resistance and effective resistivities of the bilayer film will be dominated by the thicker layer of $ZnGa_{0.05}O$ and most of the current should pass through it.

In terms of resistivity and optical transmittance behavior, an $NiO_x$ overlayer with a thickness of approximately 4-8 nm shows the optimum results. Hence, the surface characterization results of the bilayer films is presented and discussed for this optimized overlayer thickness.

Figure 24:
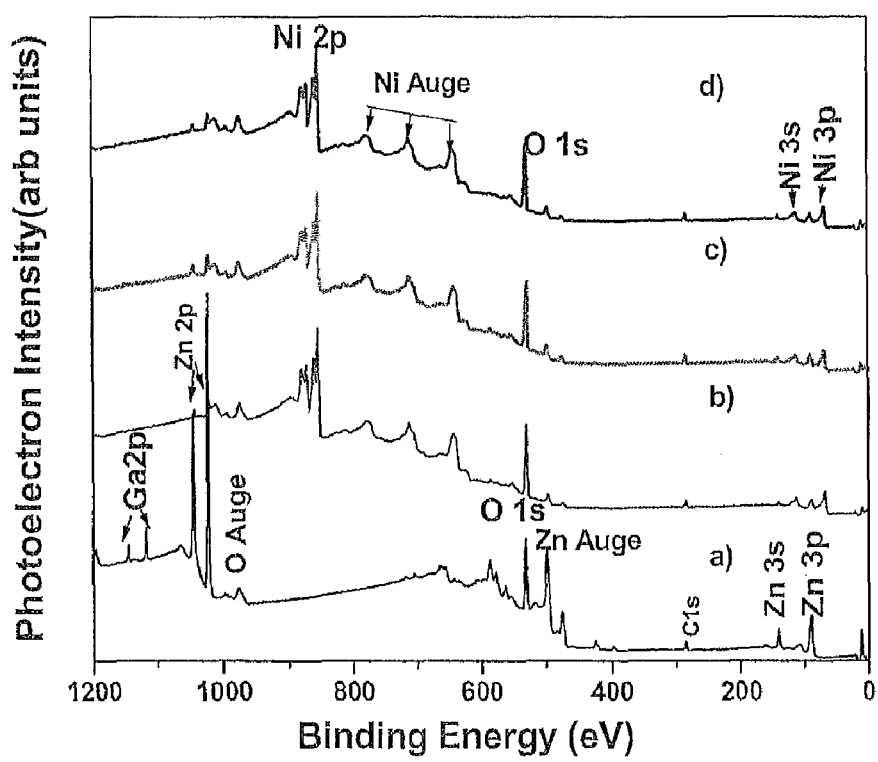
FIG. 24 is a survey XPS spectrum from the surface of (a) a Zn$_{0.95}$Ga$_{0.05}$O film, (b) a NiO$_x$ (8 nm)/ Zn$_{0.95}$Ga$_{0.05}$O film, (c) a NiO$_x$ (8 nm)/ Zn$_{0.95}$Ga$_{0.05}$O film, and (d) a Li$_{0.05}$NiO (8 nm)/Zn$_{0.95}$Ga$_{0.05}$O film.
Figure 25A:
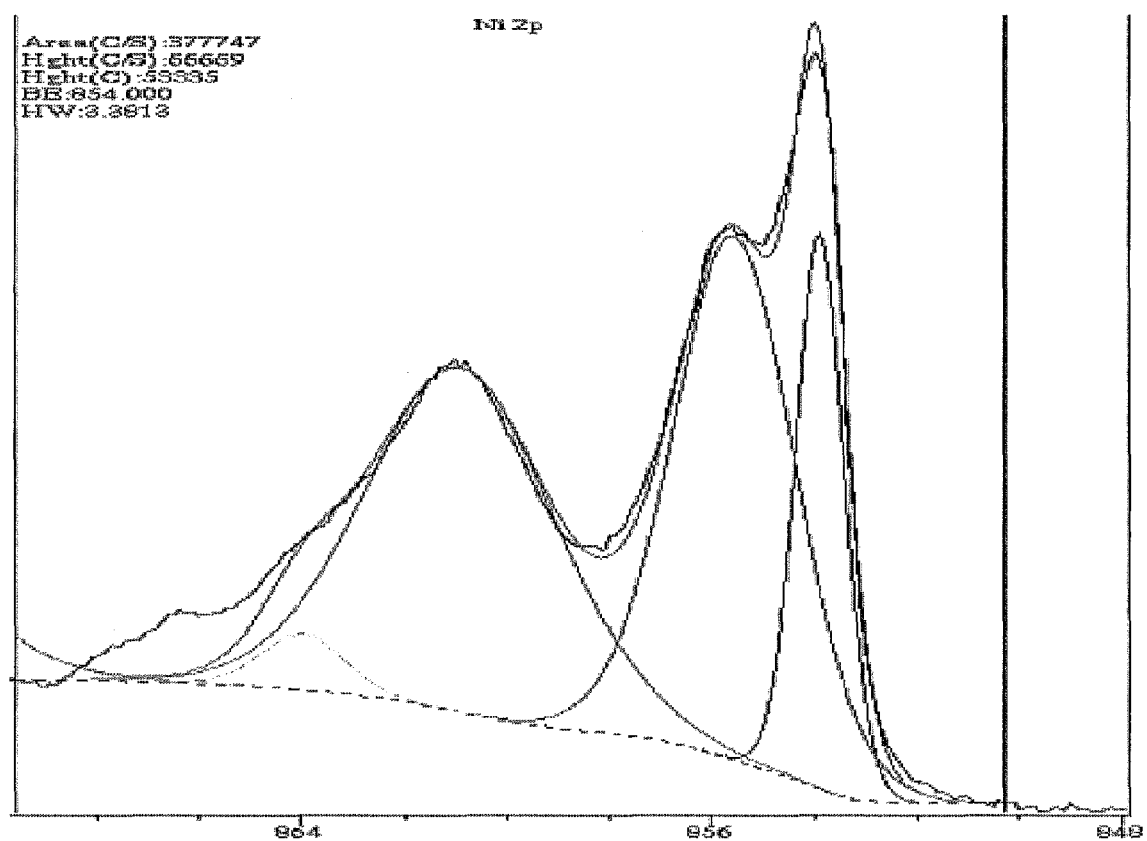
FIG. 25 is a set of high-resolution XPS spectra of the Ni 2p peak from the surface of (a) an NiO$_x$ (8 nm)/ Zn$_{0.95}$Ga$_{0.05}$O film, (b) an NiO$_x$ (8 nm)/ Zn$_{0.95}$Ga$_{0.05}$ film, and (c) a Li$_{0.05}$NiO (8 nm)/ Zn$_{0.95}$Ga$_{0.05}$O film
Figure 25B:
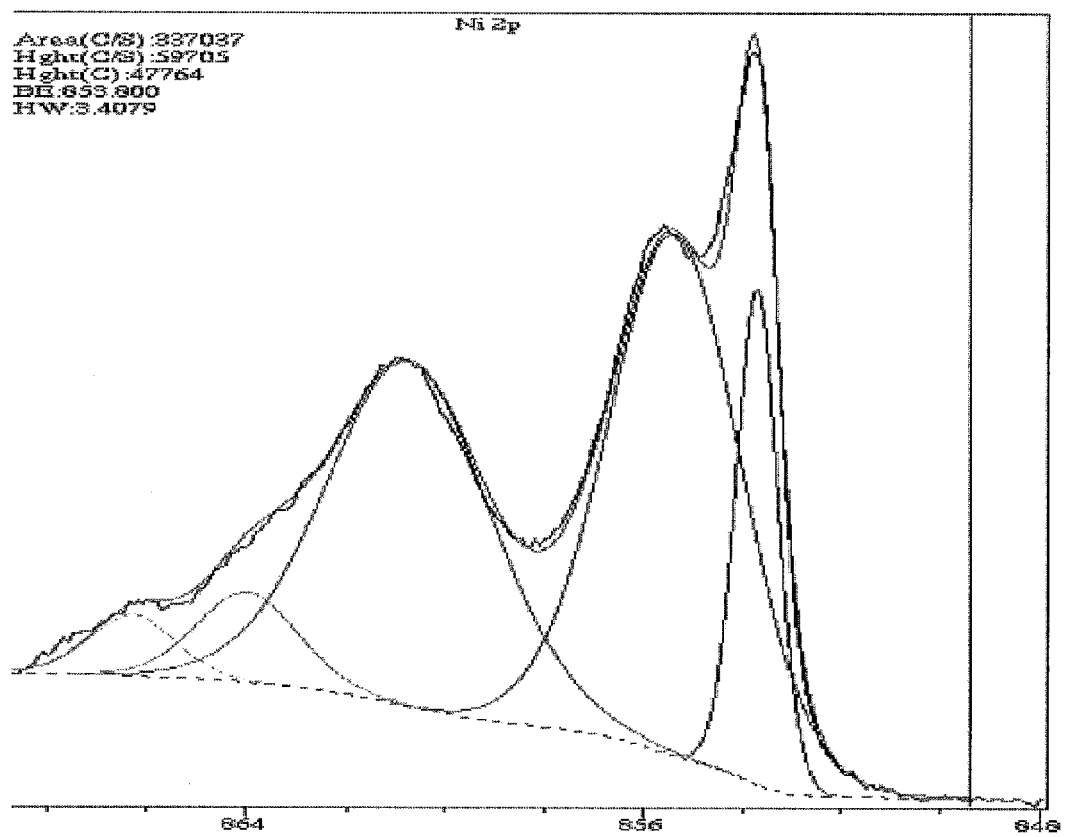
Figure 25C:
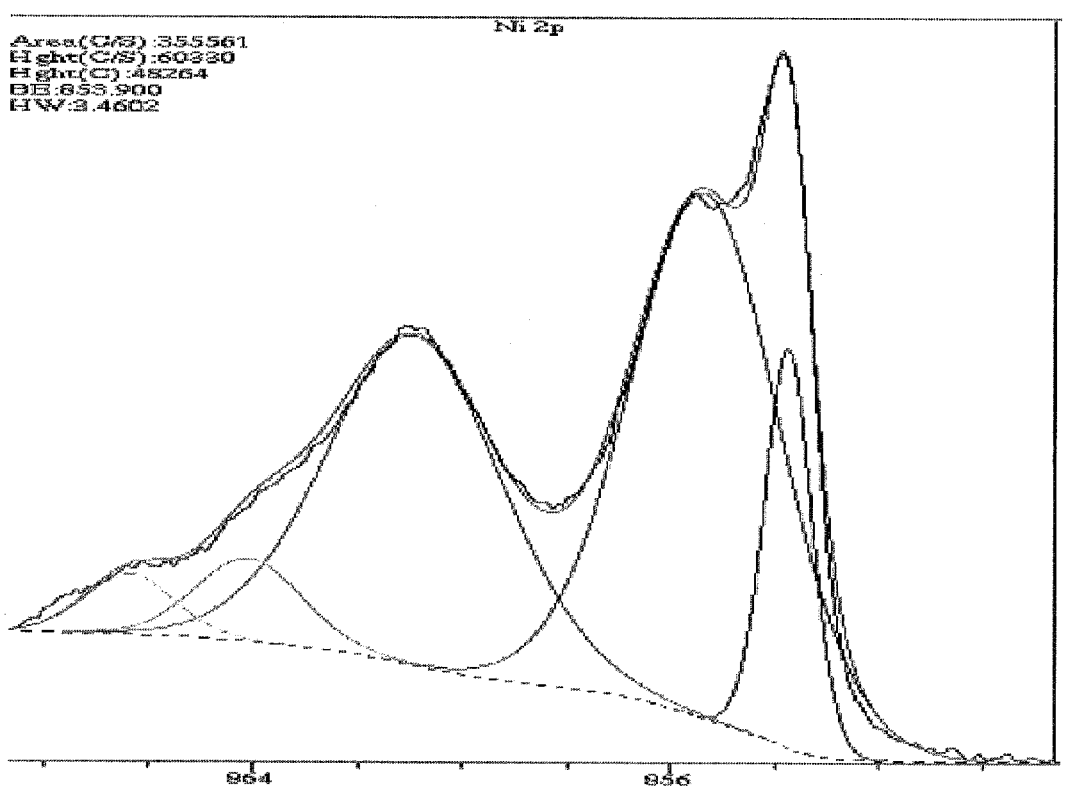

The detailed analysis of the $NiO_x$ overlayer phase was performed by XPS measurements. The XPS results shown here are from $ZnGa_{0.05}O$ and bilayer films ($NiO_x$ (8 nm)/ $ZnGa_{0.05}O$) at different growth parameters (S1, S3, S4 and S5, see description above). FIGS. 24(a), (b), (c) and (d) show the XPS survey spectra acquired from the surface of films grown at 200° C. on glass. From FIG. 24(a), the Ga $2p_{3/2}$ and Ga $2p_{1/2}$ peaks are found to be at 1116.7 eV and 1143.6 eV, respectively, which suggests the presence of $Ga^{3+}$ as noted earlier. Thus, $Ga^{3+}$ can act as a donor and effectively increase the carrier concentration. The peak positions corresponding to Ni-2p, Ni 3p, Ni 3s and O 1s for samples S3, S4 and S5 (FIGS. 24(b), (c), (d)) clearly indicate the growth of a nickel oxide layer on the $ZnGa_{0.05}O$ layer. There is no indication of any extra element present in the film from the XPS data. From the XRD data, only the peaks associated with the $Ni^{2+}$ bonding state (from NiO) were detected, confirming the presence of a single-phase nickel oxide. However, the presence of the $Ni^{3+}$ oxidation state has been verified by a high-resolution Ni 2p core-level spectrum (as shown in FIG. 25). The presence of $Ni^{3+}$ ions is known to give rise to p-type conductivity in non-stoichiometric $NiO_x$. The spectrum consists of a complex mixture of Ni $2p_{3/2,1/2}$ spin-doublets of Ni in its multiple oxidation state of +2, +3. The Ni $2p_{3/2}$ oxidation states have been resolved by using a non-linear curve fitting technique (FIG. 25(b)). The $Ni^{2+}$ ($2p_{3/2}$) and $Ni^{3+}$ ($2p_{3/2}$) peak is determined at 853.7 eV and 855.4 eV, respectively. The broad peak at 860.8 eV is designated to be an electron loss peak. The corresponding fraction of different oxidation states of Ni 2p in $NiO_x$ layer and the ratio of $Ni^{3+}/Ni^{2+}$ is summarized in Table V for samples S3, S4 and S5.

TABLE V

Values of work function determined from UPS spectra and Ni 2p bonding states from XPS spectra for different growth conditions.

|  | WF (eV) | $Ni^{2+}$ (2p) | $Ni^{3+}$ (2p) | $Ni^{3+}/Ni^{2+}$ |
|---|---|---|---|---|
| S1: ZGO | 4.6 | — | — | — |
| S3: NiO/ZGO | 5.2 | 13.0% | 31.9% | 2.5 |
| S4: NiO/ZGO | 5.3 | 12.8% | 43.2% | 3.4 |
| S5: LiNiO/ZGO | 5.3 | 11.0% | 44.0% | 4.0 |

The relative concentration of multiple oxidation states of Ni has been determined by calculating the area under the resolved peaks. There is no significant peak shift observed in the Ni $2p_{3/2}$ spectrum with the change in oxygen pressure ($PO_2$) during growth, but the relative concentration of $Ni^{2+}$ ($2p_{3/2}$) and $Ni^{3+}$ ($2p_{3/2}$) did change. As shown in Table V, the $Ni^{3+}/Ni^{2+}$ ratio increased with an increase in $PO_2$ during the growth of $NiO_x$ layer.

Figure 26:
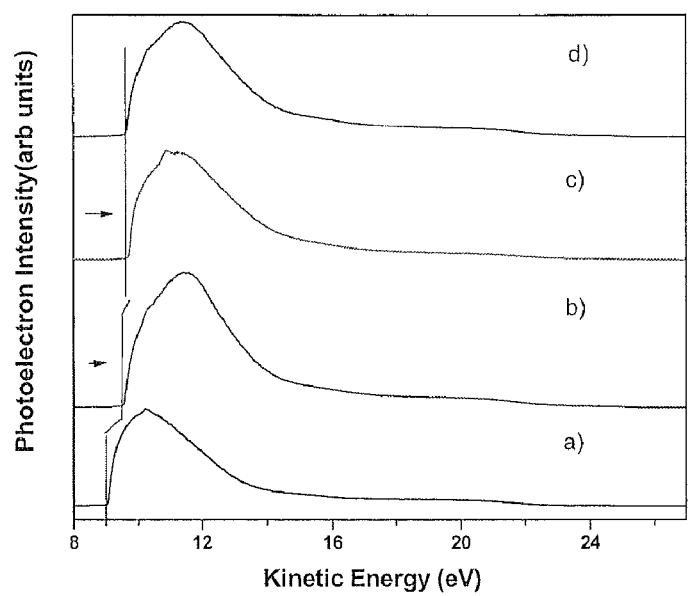
FIG. 26 is a set of comparative UPS spectra of (a) a Zn$_{0.95}$Ga$_{0.05}$O film, (b) a NiO$_x$ (8 nm)/ Zn$_{0.95}$Ga$_{0.05}$O film, (c) a NiO$_x$ (8 nm)/ Zn$_{0.95}$Ga$_{0.05}$O film, and (d) a Li$_{0.05}$NiO (8 nm)/Zn$_{0.95}$Ga$_{0.05}$O film.

The effective work functions of these modified surfaces of $ZnGa_{0.05}O$/glass are determined by UV-photoelectron spectroscopy, using an He (I) excitation source (21.2 eV). FIG. 26 compares UPS spectra of $ZnGa_{0.05}O$ and surface modified $ZnGa_{0.05}O$ ($NiO_x/ZnGa_{0.05}O$) at different growth conditions. The work function ($\Phi_{zgo}$) of all the samples is determined by the difference between the width of the photoemission spectrum and the source energy according to equation (3) set forth above.

It is revealed from the UPS spectra that the lowest kinetic energy edge for the bilayer films shift towards higher energy, resulting in the higher effective work functions than the $ZnGa_{0.05}O$ films. The work function values of the $ZnGa_{0.05}O$ and bilayer films are summarized in Table V above. The work function of the bilayer films are in the narrow range from 5.2 to 5.3 eV. The films with higher $Ni^{3+}/Ni^{2+}$ ratio in the $NiO_x$ layer showed higher work function. However, in this Example no further change in work function was observed with the $Li_{0.05}NiO$ overlayer.

It should be noted that the film grown at higher oxygen pressure (S4) has shown a higher $Ni^{3+}/Ni^{2+}$ ratio than the film (S3), suggesting that the film has a maximum amount of $Ni^{3+}$. It was also found that with the increase in oxygen concentration during growth, the resistivity of $NiO_x$ was decreased. The increase in the conductivity of non-stoichiometric $NiO_x$ can be attributed to the increase in the $Ni^{3+}$ ions due to formation of $Ni^{2+}$ vacancies and the interstitial oxygen atoms, which leads to the formation of holes in $NiO_x$. This increase in the hole concentration results in an increase in the carrier concentration and decrease in the Fermi level. The lowering of the Fermi level will eventually increase the work function of the film Hence, the higher conductivity and work function are attained for the film with higher $Ni^{3+}$ concentration.

To summarize this Example, we have grown $ZnGa_{0.05}O$ films with a very thin $NiO_x$ overlayer on glass and sapphire substrates at different conditions by the PLD technique. The bilayer films have low roughness and good crystalline quality at growth temperatures ($T_s$) as low as 200° C. The $ZnGa_{0.05}O$ films deposited on glass were highly oriented in the [0001] direction. This preferred [0001] orientation was due to the lowest surface energy of the basal plane and the high energy of the ablated species. The NiO layer shows a preferred orientation along the [111] direction on $ZnGa_{0.05}O$ (0001) and this crystallographic orientation possesses a relatively higher work function with respect to other orientations. The $ZnGa_{0.05}O$ films with a very thin $NiO_x$ overlayer grown on sapphire substrates are found to be epitaxial. The effect of varying the $NiO_x$ thickness on the electrical and optical properties of $NiO_x/ZnGa_{0.05}O$ bilayer films has also been investigated and optimum results were found for a thickness range of 4-8 nm. These properties were also measured with a $Li_{0.05}NiO$ overlayer to get a more conductive interfacial layer without affecting the overall transmittance of the anode. The bilayer films with optimum overlayer thickness possess good transparency ($\geq 85\%$) and showed a resistivity of $\sim 2 \times 10^{-4}$ Ω-cm. A significant observation was that the NiO modified $ZnGa_{0.05}O$ films showed a much higher work function (5.2-5.3 eV) as compared to the single layer $ZnGa_{0.05}O$ film (4.6 eV). The oxygen pressure during the growth of NiO layer affects the $Ni^{3+}/Ni^{2+}$ ratio. It was confirmed that with a higher amount of $Ni^{3+}$ bonding state in the film, the hole concentration is higher which leads to the higher conductivity of the $NiO_x$ overlayer and higher work function of the bilayer film On the basis of these results, it is suggested that the work function, electrical and optical properties of this $NiO_x/ZnGa_{0.05}O$ TCO can be tuned by changing the deposition parameters and/or thickness of $NiO_x$ layer. Preliminary experiments have shown promising results for the (NiO$_x$, Li$_{0.05}$NiO)/ZnGa$_{0.05}$O bilayer films deposited on glass which can be used as a transparent electrode in various devices, including OPVs and other optoelectronic devices.

REFERENCES

The following references are incorporated by reference herein in their entireties:

V. Bhosle, A. Tiwari, and J. Narayan, *Appl. Phys. Lett.* 88, 32106 (2006).

V. Bhosle, A. Tiwari, and J. Narayan, *J. Appl. Phys.* 100, 033713 (2006).

V. Bhosle, J. T. Prater, Fan Yang, D. Burk, S. R. Forrest, and J. Narayan, *J. Appl. Phys.* 102, 023501 (2007).

V. Bhosle, A. Tiwari, and J. Narayan, *J. Appl. Phys.* 97, 083539 (2005).

J. Narayan and B. C. Larson, *J. Appl. Phys.* 93, 278 (2003).

V. Bhosle, A. Tiwari, and J. Narayan, *Appl. Phys. Lett.* 88, 032106 (2006).

V. Bhosle, J. Narayan, *J. Appl. Phys.* 100, 93519 (2006).

V. Bhosle, A. Tiwari, J. Narayan, *J. Appl. Phys.* 100, 033713 (2006).

Titas Dutta, P. Gupta, V. Bhosle, and J. Narayan, *J. Appl. Phys.* 105, 053704 (2009).

U.S. Pat. No. 5,406,123.
U.S. Pat. No. 6,423,983.
U.S. Pat. No. 6,518,077.
U.S. Patent No. 7,105,118.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation the invention being defined by the claims.

What is claimed is:

1. A transparent, electrically conductive composite, comprising:
   a first layer including ZnO; and
   a second layer disposed on the first layer and including a component selected from the group consisting of MoO$_x$ where x ranges from 2.0 to 2.75 and NiO$_x$ where x ranges from 0.8 to 1.2.

2. The composite of claim 1, wherein the ZnO is doped with a dopant selected from the group consisting of gallium, aluminum, and both gallium and aluminum.

3. The composite of claim 2, wherein the dopant has a concentration ranging from 0.05 to 5 atomic %.

4. The composite of claim 1, wherein the composite has a work function ranging from 4.4 to 5.3 eV.

5. The composite of claim 1, wherein the composite has an optical transmittance ranging from 80% or greater.

6. The composite of claim 1, wherein the second layer includes MoO$_x$ and has a thickness ranging from 0.5 to 10 nm.

7. The composite of claim 1, wherein the second layer includes MoO$_x$ and the MoO$_x$ includes a combination of Mo$^{4+}$, Mo$^{5+}$ and Mo$^{6+}$ species.

8. The composite of claim 7, wherein the ratio of (Mo$^{4+}$, Mo$^{5+}$) species to Mo$^{6+}$ species ranges from 2:1 to 4:1.

9. The composite of claim 1, wherein the second layer includes MoO$_x$ and the MoO$_x$ is doped with an electron-donating species having a higher valence state than the Mo species of the MoO$_x$.

10. The composite of claim 1, wherein the second layer includes MoO$_x$ and the MoO$_x$ is doped with a dopant selected from the group consisting of manganese and rhenium.

11. The composite of claim 10, wherein the dopant has a concentration ranging from 0.5 to 5.0 atomic %.

12. The composite of claim 1, wherein the second layer includes NiO$_x$ and has a thickness ranging from 0.4 to 8 nm.

13. The composite of claim 1, wherein the second layer includes NiO$_x$ and the NiO$_x$ includes a combination of Ni$^{2+}$ and Ni$^{3+}$ species.

14. The composite of claim 13, wherein the ratio of Ni$^{3+}$ species to Ni$^{2+}$ species ranges from 2:1 to 4:1.

15. The composite of claim 1, wherein the second layer includes NiO$_x$ and the NiO$_x$ is doped with a dopant that increases the conductivity of the NiO$_x$.

16. The composite of claim 15, wherein the second layer includes NiO$_x$ and the NiO$_x$ is doped with a dopant selected from the group consisting of lithium and sodium.

17. The composite of claim 16, wherein the dopant has a concentration ranging from 0.5 to 8.0 atomic %.

18. A method for fabricating a transparent, electrically conductive composite, the method comprising:
   depositing a first layer including ZnO on a substrate; and
   depositing a second layer on the first layer, the second layer including a component selected from the group consisting of MoO$_x$ where x ranges from 2.0 to 2.75 and NiO$_x$ where x ranges from 0.8 to 1.2.

19. The method of claim 18, further comprising tuning the work function of the composite by a step selected from the group consisting of controlling the thickness of the second layer, controlling the relative concentrations of Mo$^{4+}$, Mo$^{5+}$ and Mo$^{6+}$ valence states or Ni$^{2+}$ and Ni$^{3+}$ valence states, controlling a plasma flume parameter, controlling a position of an outlet of an O$_2$ supply source relative to a laser plume, controlling deposition temperature, controlling laser energy, controlling O$_2$ partial pressure, annealing the composite, and combinations of two or more of the foregoing.

20. An electronic device, comprising:
   a semiconductor-based structure including a semiconductor material; and
   a transparent, electrically conductive composite disposed on the semiconductor-based structure and comprising a first layer including ZnO, and a second layer disposed on the first layer and including a component selected from the group consisting of MoO$_x$ where x ranges from 2.0 to 2.75 and NiO$_x$ where x ranges from 0.8 to 1.2, wherein the second layer contacts the semiconductor-based structure.

* * * * *